United States Patent
Huber et al.

(10) Patent No.: US 9,846,204 B2
(45) Date of Patent: Dec. 19, 2017

(54) STRESS AND TEMPERATURE COMPENSATED HALL SENSOR, AND METHOD

(71) Applicant: MELEXIS TECHNOLOGIES SA, Bevaix (CH)

(72) Inventors: Samuel Huber, Jenaz (CH); Samuel Francois, Metabief (FR)

(73) Assignee: MELEXIS TECHNOLOGIES SA, Bevaix (CH)

( * ) Notice: Subject to any disclaimer, the term of this patent is extended or adjusted under 35 U.S.C. 154(b) by 41 days.

(21) Appl. No.: 15/153,960

(22) Filed: May 13, 2016

(65) Prior Publication Data
US 2016/0377690 A1 Dec. 29, 2016

(30) Foreign Application Priority Data
Jun. 23, 2015 (GB) .................................. 1511076.0

(51) Int. Cl.
G01R 33/00 (2006.01)
G01R 33/07 (2006.01)

(52) U.S. Cl.
CPC ..... *G01R 33/0082* (2013.01); *G01R 33/0023* (2013.01); *G01R 33/0064* (2013.01); *G01R 33/07* (2013.01)

(58) Field of Classification Search
CPC .................................................. G01R 33/0082
USPC ....................................................... 702/104
See application file for complete search history.

(56) References Cited

U.S. PATENT DOCUMENTS

| | | | |
|---|---|---|---|
| 6,906,514 | B2 | 6/2005 | Ausserlechner |
| 7,980,138 | B2 | 7/2011 | Ausserlechner |
| 2005/0162160 | A1 | 7/2005 | Ausserlechner et al. |
| 2008/0074108 | A1 | 3/2008 | Ausserlechner |
| 2008/0111565 | A1 | 5/2008 | Ausserlechner et al. |

(Continued)

FOREIGN PATENT DOCUMENTS

| | | |
|---|---|---|
| EP | 1496344 A2 | 1/2005 |
| EP | 2871488 A1 | 5/2015 |

(Continued)

OTHER PUBLICATIONS

Great Britain Search Report from Great Britain Application No. GB1511076.0, Dec. 3, 2015.

(Continued)

*Primary Examiner* — Harry W Bryne
(74) *Attorney, Agent, or Firm* — Workman Nydegger

(57) ABSTRACT

An integrated semiconductor device for measuring a magnetic field, comprising: a Hall sensor, a first lateral isotropic sensor having a first stress sensitivity and a first temperature sensitivity, a second lateral isotropic sensor having a second stress sensitivity and a second temperature sensitivity, optional amplifying means, digitization means; and calculation means configured for calculating a stress and temperature compensated Hall value in the digital domain, based on a predefined formula which can be expressed as an n-th order polynomial in only two parameters. These parameters may be obtained directly from the sensor elements, or they may be calculated from a set of two simultaneous equations. A method of obtaining a Hall voltage signal, and compensating said signal for stress and temperature drift.

20 Claims, 14 Drawing Sheets

(56) References Cited

U.S. PATENT DOCUMENTS

| | | |
|---|---|---|
| 2012/0210800 A1 | 8/2012 | Huber et al. |
| 2012/0239350 A1* | 9/2012 | Motz .................. G01R 33/0029 702/190 |
| 2014/0009221 A1* | 1/2014 | Motz .................. G01R 33/0029 327/564 |
| 2015/0002140 A1* | 1/2015 | Lee ........................ G01R 33/07 324/207.2 |
| 2015/0137200 A1* | 5/2015 | Johnson .................. G11C 11/18 257/295 |
| 2015/0142342 A1 | 5/2015 | Huber et al. |
| 2015/0176963 A1* | 6/2015 | Diaconu .............. G01R 33/077 702/95 |
| 2015/0176964 A1* | 6/2015 | Uberti ................ G01R 33/0029 702/95 |

FOREIGN PATENT DOCUMENTS

| | | |
|---|---|---|
| WO | 2013167631 A1 | 11/2013 |
| WO | 2015067675 A1 | 5/2015 |

OTHER PUBLICATIONS

Huber, et al., "A Bridge-Type Resistive Temperature Sensor in CMOS Technology with Low Stress Sensitivity", IEEE Sensors 2014 Proceedings, Nov. 2014, pp. 1455-1458.

* cited by examiner

Orthogonal pairs: L

L-shape   $\Delta R_{L,p\text{-}poly}/R_{L,p\text{-}poly,0} = 4.9 \times 10^{-11}(\sigma_{xx}+\sigma_{yy})$ $R_x \neq R_y$ anisotropic
(due to junction field effect)

900

STRESS AND TEMPERATURE COMPENSATED HALL SENSOR, AND METHOD

FIELD OF THE INVENTION

The present invention relates in general to the field of integrated Hall sensors, and in particular to the field of integrated Hall sensors which are compensated for temperature and for mechanical stress. The present invention also relates to a method of compensating a Hall sensor readout for both mechanical stress and temperature.

BACKGROUND OF THE INVENTION

The basic functionality of a Hall sensor is to measure the magnitude of a magnetic field, based on the so called "Hall-effect", whereby a voltage is generated over a conductor (e.g. a conductive plate) when a current is flowing through said conductor in the presence of a magnetic field. This phenomenon is well known in the art, and hence need not be further explained here.

There are however several problems related to the readout of a Hall sensor:

1a) the Hall-voltage is typically very small (typically in the microvolt to millivolt range) hence needs to be amplified, but both Hall element and amplifiers may have an offset (the output of the amplifier is non-zero in the presence of a zero magnetic field). This problem is typically addressed in the prior art by measuring the offset-voltage in a calibration (during production), storing the measured value in a non-volatile memory in the device, and retrieving the stored value and subtracting it from the output of the amplifier during actual use of the device;

1b) Another problem is that this offset is not constant over time, but drifts. This problem is addressed in the prior art by using a principle called "spinning current" and/or "chopping". Switching of polarity combined with current spinning is used to eliminate both offset of the Hall element and offset of the amplifier. Stated in simple terms, this means applying the biasing current (or biasing voltage) not statically to a particular pair of input nodes and reading the result on a particular pair of output nodes, but applying the biasing current (or voltage) consecutively to different nodes of a Hall element (e.g. Hall plate), one at the time, and reading the output over corresponding output nodes, and averaging the results;

2) the Hall voltage is also temperature dependent, inter alia because the above mentioned offset of the Hall element and/or amplifier varies with temperature. This problem is typically addressed in the prior art by measuring the offset value for zero magnetic field at several different temperatures, by storing the measured offset-values in a non-volatile memory in the device, by measuring the temperature of the device during actual use (using a temperature sensor), and by compensating the amplified Hall output value using the stored offset-value for the measured temperature;

3) the Hall voltage is also dependent on mechanical stress (exerted on the Hall element), due to phenomena known as "Piezo-Hall effect" and/or "piezoresistance" effect, and also the output of the temperature sensor mentioned above is dependent on mechanical stress (exerted on the temperature sensor). Such mechanical stress is typically caused by the packaging (e.g. plastic moulded packaging). The physical phenomena of the "piezoresistive effect" and "piezo-Hall effect" are well known, and is highly desirable in stress sensors, but it is undesirable in other devices, such as a Hall sensor device. If mechanical stress would not change over time, this problem could be easily solved by the calibration test, but unfortunately, mechanical stress varies over time, inter alia because of moisture in the packaging.

Mathematical models of the piezoresistive effect and the piezo-Hall effect are known in the art, wherein mechanical stress is represented as a tensor having 6 independent components. A straight-forward mathematical approach would thus lead to a set of 6 simultaneous equations in 6 stress variables plus one additional variable for the temperature. Such a direct approach is very complex.

U.S. Pat. No. 7,980,138 recognizes the problem of stress dependence and temperature dependence, and proposes (FIG. 5 of said publication) a stress sensor that is relatively independent of temperature. The sensor has a bridge circuit with two branches, each branch has a "n-type resistor L" (i.e. two n-type resistor strips positioned at 90° with respect to each other connected in series) and "a vertical n-type resistor". Because all resistors are n-type, their temperature behaviour is the same, and thus, their ratio depends primarily on mechanical stress, and only minimal on temperature.

There is still room for improvement or for alternatives.

SUMMARY OF THE INVENTION

It is an object of embodiments of the present invention to provide a method and a device for compensating a Hall sensor for both temperature and mechanical stress.

It is an object of particular embodiments of the present invention to provide a compensation method that is easier to perform (in terms of algorithmic complexity or computing power or both), and a device that is easier to produce (e.g. is less critical to process variations).

These objectives are accomplished by a method and device according to embodiments of the present invention.

In a first aspect, the present invention provides an integrated semiconductor device for measuring a magnetic field strength, comprising: at least one Hall element configured for providing a Hall signal (Vh) indicative of the magnetic field strength to be measured; a first lateral isotropic sensor having a first stress sensitivity and a first temperature sensitivity and configured for providing a first sensor signal; a second lateral isotropic sensor having a second stress sensitivity and having a second temperature sensitivity and configured for providing a second sensor signal; wherein the first temperature sensitivity is different from the second temperature sensitivity or the first stress sensitivity is different from the second stress sensitivity or both; optional amplifying means arranged for optionally amplifying the Hall signal and for optionally amplifying the first sensor signal and for optionally amplifying the second sensor signal; digitization means arranged for digitizing the optionally amplified Hall signal and for digitizing the optionally amplified first sensor signal and for digitizing the optionally amplified second sensor signal so as to obtain three digital values; calculation means configured for solving a set of only two simultaneous polynomial equations with pre-defined coefficients in only two variables in order to obtain a stress-value and a temperature-value, and configured for calculating a stress-compensated and temperature-compensated Hall value using a predefined correction formula in only two parameters being said calculated stress value and said calculated temperature value.

With "Hall signal" is meant the "raw Hall signal" coming from the Hall element (typically a differential voltage measured over two output nodes), or the result of averaging multiple "raw" Hall measurements by a technique known as "spinning current", well known in the art, and typically used for offset-compensating.

It is an advantage of using lateral resistors (as opposed to vertical resistors), because such resistors are much easier to design and produce, and allow much better matching of the resistors (by lithography). It is an advantage that the matching of lateral resistors is less sensitive to process variations, whereas tight control of the process parameters is crucial when using vertical resistors.

In contrast to at least some prior art solutions, the solution proposed by the present invention does not require an ideal temperature sensor (read: stress-insensitive temperature sensor) and/or an ideal stress sensor (read: temperature-insensitive stress sensor), but exploits the fact that both sensors are sensitive (to some degree) to stress and to temperature.

In contrast to at least some prior art solutions, the solution proposed by the present invention addresses the problem of determining the "true" stress and the "true" temperature primarily in the back-end (by solving a set of simultaneous equations in the digital domain), rather than primarily at the front-end (in hardware). This allows for an easier implementation, and provides more degrees of freedom in the design layout, as opposed to some prior art solutions, which implement vertical resistors and/or require resistors of different sizes (for example one resistor being a factor 8 larger than the other) for obtaining particular effects, such as making (nearly) stress-insensitive resistors.

It is an advantage that such an integrated semiconductor device can be produced in mass-production using CMOS-technology.

It is an advantage of polynomial equations using constant coefficients (which are stress and temperature independent), because (1) the coefficients can be relatively easily found using measurements and curve-fitting, and (2) because only a limited number of coefficients are to be stored in a non-volatile memory of the device (e.g. as parameters or hardcoded), and (3) such set of equations is relatively easy to solve, with limited processing power (because for example no exponential function or geometric functions are required).

It is an advantage of embodiments wherein the Hall element and the first and second sensors are supplied with the supply voltage, due to ratiometric design and ADC.

The integrated semiconductor device may further comprise output means for providing one or more of: the digitized and optionally amplified Hall signal, the digitized and optionally amplified first sensor signal, the digitized and optionally amplified second sensor signal, the calculated stress, the calculated temperature, the stress-compensated and temperature-compensated Hall value.

Preferably, each of the first lateral isotropic sensor and the second lateral isotropic sensor are resistive sensors.

Preferably, each of the first lateral isotropic sensor and the second lateral isotropic sensor are resistive sensors arranged in a bridge circuit, each bridge circuit comprising or consisting of four isotropic resistors.

It is an advantage of using a bridge circuit in that it provides a differential voltage signal with a high sensitivity, allowing even very small differences between the individual resistors to be measured. It is a further advantage of using a bridge circuit in that not the absolute values of the individual resistors are important, only their ratio.

In an embodiment, the polynomial equations of the simultaneous set of only two equations are two n-th order polynomials in only two variables, which set of only two equations is expressed by, or equivalent to the following set of equations:

$$\begin{cases} V_1 = \sum_{i=0,j=0}^{L} \alpha_{ij} . \Delta \sigma_{iso}^i . \Delta T^j \\ V_2 = \sum_{i=0,j=0}^{L} \beta_{ij} . \Delta \sigma_{iso}^i . \Delta T^j \end{cases}$$

where V1 is the digitized and optionally amplified output value of the first sensor, V2 is the digitized and optionally amplified output value of the second sensor, $\alpha_{ij}$ and $\beta_{ij}$ are constants, K, L, i, j are integer values, $\Delta\sigma_{iso}$ represents mechanical stress relative to a reference stress, and $\Delta T$ represents temperature relative to a reference temperature, and K represents the order of the polynomial of the first equation, and L represents the order of the polynomial of the second equation.

It is an advantage of using polynomials, because they are relatively easy to calculate (without demanding huge processing power, unlike for example geometric or exponential functions), yet allow highly accurate results.

For a given design (e.g. particular layout and material), the constants are fixed, and may be determined for example at the design-stage by simulation or by design-evaluation measurements using curve-fitting techniques.

It is an advantage that $\alpha_{00}$ and $\beta_{00}$ can be measured directly as the output value of the first and second sensor, under chosen reference conditions.

In an embodiment, the set of equations is a set of second order polynomial equations.

This means that K=L=2 in the formula above (and that at least one of the second order coefficients is non-zero). It is an advantage of using "only" second-order polynomials because in that case the number of coefficients of the simultaneous set of equations is only about 18 coefficients, including the offset-value Voffset1 and Voffset2 of the first and second sensor, or even less than 18, in case some coefficients are omitted.

In an embodiment, the set of equations can be expressed by, or is equivalent to:

$$\begin{cases} \Delta V1 = \alpha_{11}.\Delta\sigma_{iso}.\Delta T + \alpha_{02}.\Delta T \wedge 2 + \alpha_{10}.\Delta\sigma_{iso} + \alpha_{01}.\Delta T \\ \Delta V2 = \beta_{11}.\Delta\sigma_{iso}.\Delta T + \beta_{02}.\Delta T \wedge 2 + \beta_{10}.\Delta\sigma_{iso} + \beta_{01}.\Delta T \end{cases}$$

This embodiment has the advantage that only eight coefficients need to be determined (for the simultaneous set of equations) by curve-fitting, and need to be stored in non-volatile memory, and that the set of equations is easier/faster to solve. Yet, it is found that this set of equations can yield highly accurate results within a relative broad temperature range (from about 0° C. to about +140° C.).

In an embodiment, the predefined correction formula can be expressed by, or is equivalent to the following formula: VHcomp=VH/CF, wherein CF is a correction factor, which can be expressed by, or is equivalent to the following n-th order polynomial in only two variables:

$$CF = \sum_{i=0, j=0}^{M} \gamma_{ij} . \Delta \sigma_{iso}^{i} . \Delta T^{j}$$

wherein $\gamma_{ij}$ are predefined constants, M, i, j are integers, and ($\Delta\sigma_{iso}$) and ($\Delta T$) are the values calculated from the set of two simultaneous equations, and M represents the order of the polynomial.

It was found that this correction factor provides very good results, even for a relatively low order M.

In another embodiment, the predefined correction formula can be expressed by, or is equivalent to the following formula: VHcomp=VH×CFb, where CFb is a correction factor, which can be expressed by, or is equivalent to the following n-th order polynomial in only two variables:

$$CFb = \sum_{i=0, j=0}^{R} \tau_{ij} . \Delta \sigma_{iso}^{i} . \Delta T^{j}$$

wherein $\tau_{ij}$ are predefined constants, R, i, j are integers, and ($\Delta\sigma_{iso}$) and ($\Delta T$) are the values calculated from the set of two simultaneous equations, and R represents the order of the polynomial.

This formula offers approximately the same accuracy as the formula of CF, but the formula has the advantage of using a multiplication operation rather than a division operation.

According to a second aspect, the present invention provides an integrated semiconductor device for measuring a magnetic field strength, comprising: at least one Hall element configured for providing a Hall signal indicative of the magnetic field strength to be measured; a first lateral isotropic sensor having a first stress sensitivity and a first temperature sensitivity and configured for providing a first sensor signal; a second lateral isotropic sensor having a second stress sensitivity and having a second temperature sensitivity and configured for providing a second sensor signal; wherein the first temperature sensitivity is different from the second temperature sensitivity or the first stress sensitivity is different from the second stress sensitivity or both; optional amplifying means arranged for optionally amplifying the Hall signal and for optionally amplifying the first sensor signal and for optionally amplifying the second sensor signal; digitization means arranged for digitizing the optionally amplified Hall signal and for digitizing the optionally amplified first sensor signal and for digitizing the optionally amplified second sensor signal so as to obtain three digital values; calculation means configured for calculating a stress-compensated and temperature-compensated Hall value using a predefined correction formula in only two parameters being said digitized and optionally amplified first sensor signal and said digitized and optionally amplified second sensor signal.

The integrated semiconductor device may further comprise output means for providing one or more of: the digitized and optionally amplified Hall signal, the digitized and optionally amplified first sensor signal, the digitized and optionally amplified second sensor signal, the stress-compensated and temperature-compensated Hall value.

Preferably, each of the first lateral isotropic sensor and the second lateral isotropic sensor are resistive sensors.

Preferably, each of the first lateral isotropic sensor and the second lateral isotropic sensor are resistive sensors arranged in a bridge circuit, each bridge circuit comprising or consisting of four isotropic resistors.

Embodiments according to the second aspect offer the same advantages as mentioned for the first aspect, but in addition offer the advantage of not having to calculate the actual stress and temperature values, but they allow to calculate the compensation factor, using the output values of the two sensors directly.

Thus, one or more of the following advantages are obtained: a less powerful computation means is required, silicon area can be saved, less power is required for performing the calculation, more Hall measurements can be performed per time unit (i.e. the measurement bandwidth can be increased), the accuracy of the result (e.g. in terms of rounding errors) may be improved (when using the same number of bits of the ADC and of the processor, e.g. 14 bit ADC, 16 bit processor).

In an embodiment, the predefined correction formula can be expressed by, or is equivalent to the following formula: VHcomp=VH/CF, wherein CF is a correction factor, which can be expressed by, or is equivalent to the following n-th order polynomial in only two variables:

$$CF = \sum_{i=0, j=0}^{M} \varphi_{ij} . (\Delta V1)^{i} . (\Delta V2)^{j}$$

wherein $\Delta V1 = V1 - V1o$, $\Delta V2 = V2 - V2o$, V1o being a digitized and optionally amplified output of the first sensor measured during calibration, V2o being a digitized and optionally amplified output of the second sensor measured during calibration, $\phi_{ij}$ are predefined constants; M, i, j are integers; and M represents the order of the polynomial.

The same advantages and remarks as mentioned above for the correction factor CF of the first embodiment are also applicable here.

In another embodiment, the predefined correction formula can be expressed by, or is equivalent to the following formula: VHcomp=VH×CFb, where CFb is a correction factor, which can be expressed by, or is equivalent to the following n-th order polynomial in only two variables:

$$CFb = \sum_{i=0, j=0}^{R} \eta_{ij} . (\Delta V1)^{i} . (\Delta V2)^{j}$$

wherein $\Delta V1 = V1 - V1o$, $\Delta V2 = V2 - V2o$, V1o being a digitized and optionally amplified output of the first sensor measured during calibration, V2o being a digitized and optionally amplified output of the second sensor measured during calibration, $\eta_{ij}$ are predefined constants, R, i, j are integers, and R represents the order of the polynomial.

This formula offers approximately the same accuracy as the formula of CF, but the formula has the advantage of using a multiplication operation rather than a division operation.

In an embodiment, the polynomial of the correction factor is one of: i) a second order polynomial in both variables, ii) a polynomial of third order in the variable related to the sensor having the highest temperature sensitivity of the first and second sensor and of first order in the other variable; iii) a polynomial of fourth order in the variable related to the sensor having the highest temperature sensitivity of the first and second sensor and of first order in the other variable.

It was found that, for the applications under consideration, where the stress is only due to package stress, first order terms of the value related to the "stress sensor" is typically sufficient, whereas a second, third or fourth order terms of the values related to the "temperature sensor" would be desirable/required for obtaining accurate results in a relative large temperature range (e.g. from −40° C. to +120° C.), although both sensors may be sensitive to both temperature and stress.

Optionally in case ii) or case iii) mentioned here above, the calculation means is adapted for evaluating the polynomial expression as a piecewise linear or a piecewise quadratic approximation using equidistant or non-equidistant intervals of the first and/or second variable.

Piecewise linear or quadratic approximation may further reduce the computational complexity and/or power requirements. By choosing appropriate intervals, any desired accuracy can be obtained, while at the same time calculation of a higher order polynomial can be avoided.

In embodiments according to the first or second aspect, the semiconductor device further comprising non-volatile storage means operatively connected to the calculation means, the storage means being adapted for storing at least two values determined during calibration, and optionally for storing also the predefined coefficients of the polynomial equations.

In embodiments according to the first or second aspect, the integrated semiconductor device further comprises means for biasing the at least one Hall element and the first sensor and the second sensor with a constant predefined voltage.

It is an advantage of using a constant predefined voltage, e.g. a temperature compensated voltage, that the signal-to-noise ratio may be increased, e.g. maximized over the envisioned temperature range.

In embodiments according to the first or second aspect, the at least one Hall element is a horizontal Hall plate.

It is an advantage of using a horizontal Hall plate (rather than a vertical Hall plate) in that it provides a larger signal, and in that it is easier to manufacture.

In embodiments according to the first or second aspect, each of the first lateral isotropic sensor and the second lateral isotropic sensor is a resistive sensor comprising four lateral isotropic resistors.

In embodiments according to the first or second aspect, each of the lateral isotropic resistors comprise at least two lateral resistor strips organized as an orthogonal pair, connected in series.

It is an advantage of this so called "L-layout" with 2 resistor strips (of the same size and material) being connected in series, and oriented at 90°, because the combined resistor is isotropic to stress components in the XY plane.

In embodiments according to the first or second aspect, at least some of the lateral isotropic resistors comprise at least four lateral resistor strips connected in series in a double-L shape.

It is an advantage of this so called "double-L-layout" with 4 resistors (of the same size and material) being connected in series, because the combined resistor is isotropic to lateral stress (in the XY plane), even in the presence of junction field effect (e.g. when the resistor is implemented as an n-well or p-well resistor).

In embodiments according to the first or second aspect, materials of the resistors are chosen such that two resistors of the first lateral isotropic sensor are made of a first material and the two other resistors of the first lateral isotropic sensor are made of a second material, and two resistors of the second lateral isotropic sensor are made of a third material and the two other resistors of the second lateral isotropic sensor are made of a fourth material, and at least three of the first, second, third and fourth material are different materials.

By choosing three or four different materials for the resistors of the sensors, the stress & temperature behaviour of the first sensor can be chosen considerably different from the stress & temperature behaviour of the second sensor, (not just differences within a tolerance margin, but for example at least a factor 1.5 different). It is an advantage of using such sensors that they allow to find quite accurate results of the true stress and true temperature value (relative to a reference value), and thus allow for a good compensation of the Hall value.

It is an advantage of using three different materials that the "true stress" and "true temperature" (relative to a reference value) can be calculated with an accuracy of about +/−3 MPa and about +/−1 K (as compared to about +/−10 MPa and about +/−5K before the present invention was made).

It is an advantage that the knowledge of the "true stress" and "true temperature" values allows to compensate the Hall value for parasitic effects.

In embodiments according to the first or second aspect, materials of the resistors are chosen such that two of the resistors of the first sensor are p-well resistors, and two other of the resistors of the first sensor are p-poly resistors, and two of the resistors of the second sensor are heavily doped p-type, also known as "p-diff" resistors, and two other of the resistors of the second sensor are heavily doped n-type, also known as "n-diff" resistors.

It is an advantage of using a p-well or n-well resistor as part of the sensor, because lightly doped material has higher temperature coefficient of resistivity, thus the temperature sensitivity is higher.

In embodiments according to the first or second aspect, materials of the resistors are chosen such that two of the resistors of the first sensor are heavily doped p-type, also known as "p-diff" resistors, and two other of the resistors of the first sensor are p-poly resistors, and two of the resistors of the second sensor are heavily doped n-type, also known as "n-diff" resistors, and two other of the resistors of the second sensor are heavily doped p-type, also known as "p-diff" resistors.

It is an advantage of this embodiment in that it does not require resistors implemented in an p-well or n-well, and thus does not require a double-L layout. This makes it easier to place the resistors of the sensors around the Hall-plate, yielding relative large sensors, which allows obtaining more accurate results.

In embodiments according to the first or second aspect, materials of the resistors are chosen such that two of the resistors of the first sensor are n-well resistors, and two other of the resistors of the first sensor are p-poly resistors, and two of the resistors of the second sensor are heavily doped n-type, also known as "n-diff" resistors, and two other of the resistors of the second sensor are heavily doped p-type, also known as "p-diff" resistors.

It is an advantage that the n-well and p-poly combination gives high thermal sensitivity (good temperature sensor), but does not require an isolated p-well.

This implementation may be especially advantageous to implement in CMOS products which do not have an isolated p-well available. In such a technology the solution combining p-well and p-poly is not feasible, but the combination of materials as recited above is very well suitable.

The present invention is for example particularly advantageous if the first sensor ("temperature sensor"), is made of n-well & p-poly resistors, because in that case the temperature sensor is very much influenced by mechanical stress, which is eliminated by the solution offered by the present invention.

In embodiments according to the first or second aspect, the integrated semiconductor device comprises a number N of at least two Hall elements located on an imaginary circle, and a single first lateral isotropic sensor located inside the circle, and the same number N of second sensors, each arranged around one of the Hall elements.

In embodiments according to the first or second aspect, the integrated semiconductor device comprises a number N of at least two Hall elements, each Hall element having a corresponding first sensor and a corresponding second sensor arranged around the Hall element.

It is an advantage that all the resistors of the first and second sensor can be arranged around the Hall plate, or in a device having multiple Hall elements, around each Hall element. In such an embodiment, each Hall element may be compensated by individual (local) temperature and stress information.

According to a third aspect, the present invention provides a method of measuring a magnetic field strength compensated for mechanical stress and for temperature, using a semiconductor device according to the first aspect, the method comprising the steps of: a) obtaining a Hall signal from said at least one Hall element; b) obtaining a first sensor signal from the first lateral isotropic sensor; c) obtaining a second sensor signal from the second lateral isotropic sensor; d) amplifying the Hall signal and optionally amplifying the first sensor signal and optionally amplifying the second sensor signal; e) digitizing the amplified Hall signal and the optionally amplified first sensor signal and the optionally amplified second sensor signal so as to obtain three digital values; f) calculating a stress value and a temperature value that satisfy a predetermined set of only two simultaneous n-th order polynomial equations in only two variables, with predefined coefficients and with the digitized and optionally amplified first and second sensor signals as parameters; g) calculating a stress compensated and temperature compensated Hall value using a correction factor being a n-th order polynomial expression in only two variables and with predefined coefficients.

The method may further comprise step h) optionally outputting any of the digitized signals.

The method may further comprise step i) optionally outputting the calculated stress and/or the calculated temperature.

The method may further comprise step j) optionally outputting the stress compensated and temperature compensated Hall value.

This method is illustrated in FIG. 13. Step a) may comprise obtaining multiple Hall measurements using the spinning current technique, and the method may further comprise a step of averaging the results in the analogue domain or in the digital domain before performing step f).

It is explicitly pointed out that the steps are numbered only for legibility, but may be performed in another order as explicitly described. Optionally some steps may be performed in parallel (e.g. measuring the first sensor signal and amplifying it and digitizing it is done at the same time).

It is an advantage of this method that it can be performed on a relatively simple processor (e.g. a 16 microcontroller running at 8 MHz). Solving the simultaneous set of equations may be implemented iteratively.

It is an advantage of this method that it "calculates" the compensated value in the digital domain, which is more flexible and accurate than in the analog domain. It also allows compensation to be performed by calibration without having to trim silicon.

It is an advantage of this method that it can be implemented relatively easily on a programmable processor having relatively simple arithmetic functions (plus, minus, multiply and division) but not goniometric or exponential functions or the like.

According to a fourth aspect the present invention provides a method of measuring a magnetic field strength compensated for mechanical stress and for temperature, using a semiconductor device according to the second aspect, the method comprising the steps of: a) obtaining a Hall signal from said at least one Hall element; b) obtaining a first sensor signal from the first lateral isotropic sensor; c) obtaining a second sensor signal from the second lateral isotropic sensor; d) amplifying the Hall signal and optionally amplifying the first sensor signal and optionally amplifying the second sensor signal; e) digitizing the amplified Hall signal and the optionally amplified first sensor signal and the optionally amplified second sensor signal so as to obtain three digital values; f) calculating a stress compensated and temperature compensated Hall value using a correction factor being a n-th order polynomial expression in only two parameters and with predefined coefficients.

The method may further comprise step g) optionally outputting any of the digitized signals.

The method may further comprise step h) optionally outputting the stress compensated and temperature compensated Hall value.

This method is illustrated in FIG. 14. The same advantages and remarks mentioned for the method of the third aspect are applicable here, but a comparison of the methods makes clear that in the method according to the fourth aspect, the intermediate step of first calculating the true values of stress and temperature can be skipped, hence this method requires less power and/or resources, and can be performed even faster (assuming the same processor and clock speed).

These and other aspects of the invention will be apparent from and elucidated with reference to the embodiment(s) described hereinafter. Particular and preferred aspects of the invention are set out in the accompanying independent and dependent claims.

BRIEF DESCRIPTION OF THE DRAWINGS

FIG. 16(a) is a schematic diagram, FIG. 16(b) is a layout-implementation.

FIG. 17(a) is a schematic diagram, FIG. 17(b) is a layout-implementation.

Figure 1:
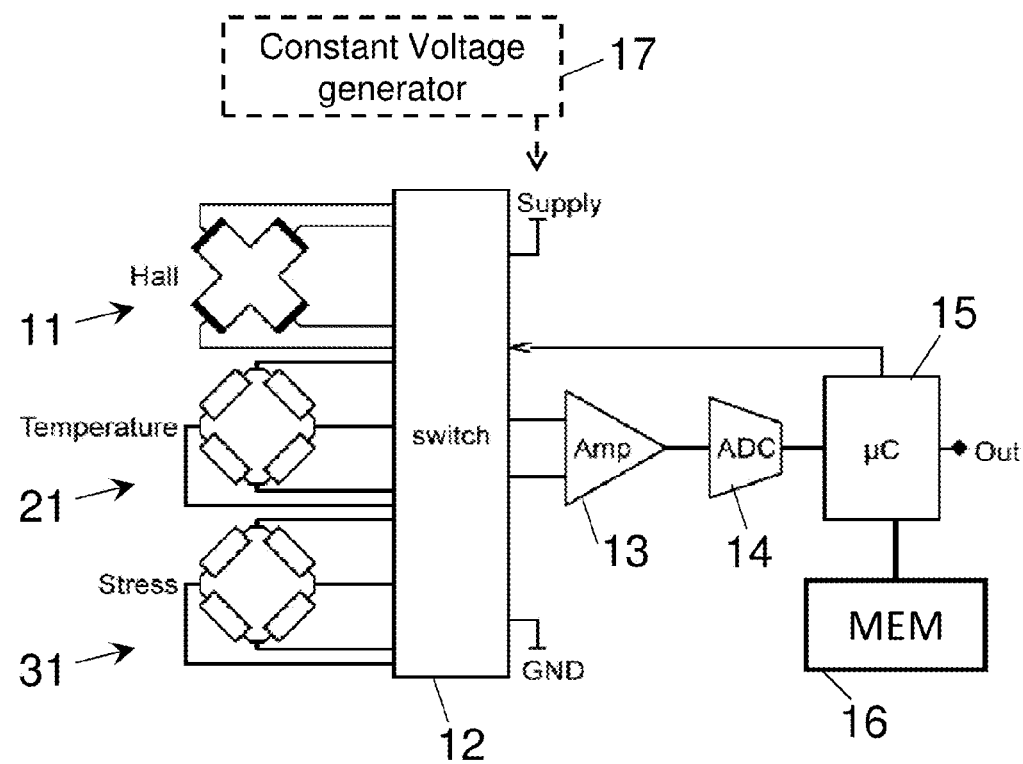
FIG. 1 shows a block-diagram of an exemplary device according to the present invention comprising a Hall element, two sensors, a readout-circuit and a digital processing circuit, and an optional constant voltage generator for biasing the Hall element(s) and the sensor elements.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only or most relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention is concerned with a method and an integrated circuit for measuring a magnetic field strength, that is compensated for both temperature and mechanical stress, hence has a reduced drift versus changing environmental conditions and over the lifetime of the sensor.

Where the term "stress" is used in the present invention, "mechanical stress" is meant (as opposed to e.g. voltage stress), unless explicitly mentioned otherwise.

In this document, the expression "a set of two equations in two variables" means "a set of only two equations in only two variables", which is also equivalent to "a set of exactly two equations in exactly two variables".

In this document, unless explicitly mentioned otherwise, the terms "variables" and "parameters" have the same meaning, and can be used interchangeably. The term "variables" is typically used to express the values to be found which satisfy a set of equations, and the term "parameter" is more commonly used to indicate the values that need to be filled out in a predefined formula, irrespective of whether that value is directly measured (as is the case for the second method) or whether that value is first calculated from a set of equations (as in the first method). In both cases these values are not fixed beforehand. These values are typically (temporarily) stored in RAM. In contrast, values of "coefficients" and/or "offset" are determined beforehand, e.g. during design stage and/or during calibration stage, and the latter values are typically stored in non-volatile memory such as e.g. flash or EEPROM, or a combination of these. The term "offset" or "offset value" can be considered as a special case of a coefficient, e.g. that of the zero-order polynomial term $X^0Y^0$, where X and Y represent variables or parameters. Offset values are typically determined on a device-per-device basis during calibration, whereas coefficients are typically determined for a group of devices, e.g. for a single batch of a single die, or for an entire design in a specific technology. But how these are determined is not relevant for the present invention, and it suffices to know that these values are "predetermined" during actual use of the device. This paragraph is not intended to limit the present invention in any way, but only to help clarify some terms.

With "p-poly" is meant "p-type polycrystalline".

With "n-poly" is meant "n-type polycrystalline".

With "p-diff" is meant "highly doped p-type resistor" or "heavily doped p-type resistor". With "heavily doped" is meant having a doping concentration of at least $1.0 \times 10^{18}/cm^3$, for example in the range of $1 \times 10^{19}/cm^3$ to $1 \times 10^{20}/cm^3$.

With "n-diff" is meant "highly doped n-type resistor" or "heavily doped n-type resistor". With "heavily doped" is meant having a doping concentration of at least $1.0 \times 10^{18}/cm^3$, for example in the range of $1 \times 10^{19}/cm^3$ to $1 \times 10^{20}/cm^3$.

Where in this document reference is made to "directly measured", what is meant is a particular value obtained from the Hall element or obtained from a sensor by the digital processor, after digitization and the optional amplification.

The problem related to temperature and stress dependence of a Hall sensor is known in the art for several decades, but there seem to be only very few solutions that compensate for both temperature and stress variations.

As far as is known to the inventors, the solutions proposed thus far in the prior art seem to be focused on building an ideal stress sensor (i.e. a sensor structure that is only sensitive to stress and not to temperature) thus capable of providing a signal proportional to the stress exerted on the device, or on building an ideal temperature sensor (i.e. a sensor structure that is only sensitive to temperature but not to stress) thus capable of providing a signal proportional to the temperature of the device.

There seems to be a prejudice in the field that the "true stress" can only be determined by using a stress sensor that is insensitive (or only marginally sensitive) to temperature, and that the "true temperature" can only be determined by using a temperature sensor that is insensitive (or only marginally sensitive) to stress.

There also seems to be a prejudice in the field that a mathematical approach is not possible or overly complex and therefore not practically feasible.

The solution proposed in U.S. Pat. No. 7,980,138 (already discussed in the background section, and further referred to as [ref 1]) is an example of this prejudice, and provides a stress sensor having only a minimal temperature sensitivity.

In the publication "A Bridge-Type Resistive Temperature Sensor in CMOS Technology with Low Stress Sensitivity" by Samuel Huber et al., published in SENSORS, 2014 IEEE, pp 1455-1458, further referred to herein as [ref 2], a temperature sensor is proposed which has only a minimal sensitivity to stress.

In both above mentioned approaches, the underlying idea seems to be to provide specific hardware that allows measurement of only a single influence (either mechanical stress or temperature but not both) while being insensitive to the other (temperature or mechanical stress), or the impact of the latter being as small as possible. If Temperature Sensitivity of the first & second sensor is represented by TS1, TS2 respectively, and Stress Sensitivity of the first & second sensor is represented by SS1, SS2 respectively, the prior art approaches can be formulated as follows:

[ref 1] provides: a stress sensor with negligible temperature sensitivity (TS2≈0)

[ref 2] provides: a temperature sensor with negligible stress sensitivity (SS1≈0).

In contrast, the inventors of the present invention followed a categorically different approach, wherein the two sensors are allowed to both be sensitive to mechanical stress and to temperature, they should have a "different sensitivity". Expressed in mathematical terms, the two sensors should have:
  i) a different sensitivity to stress (SS1< >SS2), (irrespective of whether TS1 is equal, nearly equal or not equal to TS2), or
  ii) a different sensitivity to temperature (TS1< >TS2), (irrespective of whether SS1 is equal, nearly equal or not equal to SS2), or
  iii) a different sensitivity to both mechanical stress and temperature (SS1< >SS2 and TS1< >TS2).
  iv) (a theoretically more exact mathematical formulation will be stated further, but in practice the above expressions are sufficient).

In some embodiments of the present invention, the sensitivity of both sensors to mechanical stress and to temperature is not negligible (for example: each of SS1 and SS2>20 mV/GPa in absolute value, and each of TS1 and TS2>0.10 mV/K in absolute value.

In addition, the inventors decided to use only lateral and isotropic resistors in both sensors. Using only lateral resistors means that no "vertical resistors" (i.e. extending in a direction perpendicular to the substrate surface) are needed, which greatly relaxes process constraints, and allows better matching of the resistors because the ratio of lateral resistor values is determined primarily by lithography. Furthermore, when only lateral components are used, a layout can easily be shrinked (which is not possible for a design with vertical components, e.g. with a vertical resistor). Furthermore, lateral resistors allow also to place the resistors in the immediate vicinity of the Hall element, preferably or ideally surrounding it entirely. This improves the matching of the temperature and the stress of the Hall element, the first, and the second sensor.

Probably most importantly, the inventors have found that, when using only lateral and isotropic resistors, the set of 6 equations (known in the art), which is extremely complex, can surprisingly be reduced to a relatively simple set of only 2 equations in only two variables: $\sigma_{iso}$ and T, wherein $$\sigma_{iso}=(\sigma_{xx}+\sigma_{yy}) \quad [1]$$

represents the isotropic mechanical stress, and T represents the temperature.

It is noted that the approach of two simultaneous equations implicitly assumes that both sensors experience the same temperature T and are subject to the same stress, which in practice is only approximately true, but the approximation is more accurate as the sensors are positioned closer to each other on the same die. In order to quantify the term "sufficiently close", in embodiments of the present invention, and as illustrated in FIG. 12, a distance "d3" between the center (or geometrical center of gravity) of the first sensor 1221 and the center (or geometrical center of gravity) of the second sensor 1222 is preferably smaller than 10 times, preferably smaller than 6 times, preferably smaller than 4 times, preferably smaller than 3 times, preferably smaller than 2 times, the average diameter davg=(d1+d2)/2, where d1, d2 is the diameter of the smallest imaginary circle which completely surrounds the first/second sensor respectively. In particular examples, the two sensors 1221, 1222 may even have coinciding centers as shown for example in FIG. 11.

I. Calculation of Stress and Temperature

The set of two simultaneous equations can be written as:

$$\begin{cases} V1 = f1(T, \sigma_{iso}) & [2] \\ V2 = f2(T, \sigma_{iso}) & [3] \end{cases}$$

where V1 is the value measured by the first sensor after (optional amplification and) digitization, and V2 is the value measured by the second sensor after (optional amplification and) digitization.

Moreover, it was surprisingly found that the functions f1 and f2 in only two variables can be advantageously approximated by two polynomial expressions or relatively small order (e.g. only fourth order or less).

Furthermore, it was found particularly advantageous not to use the absolute value of T and $\sigma_{iso}$, but a value $\Delta T$ relative to a reference temperature Tref, and a value $\Delta\sigma_{iso}$ relative to a reference isotropic mechanical stress value experienced by the same two sensors but measured under different conditions (e.g. the stress present after packaging or during wafer probing). If the measurement of formula [2] and [3] is performed at the reference temperature and reference stress, or stated otherwise, if the temperature and stress at which the measurement of V1 and V2 are performed is considered as "the reference temperature" and "the reference stress", then the measured value V1 is the offset of the first sensor, and the measured value V2 is the offset of the second sensor.

Thus:

$$\begin{cases} \Delta\sigma_{iso} = \sigma_{iso} - \sigma_{iso\_ref}, \text{ and} & [4] \\ \Delta T = T - T_{ref} & [5] \end{cases}$$

This notation allows to perform calculations even though the exact magnitude of the reference stress $\sigma_{iso\_ref}$ itself is not known. The offset measurement can be performed at any temperature, e.g. Tref can be about 20° C., or any other suitable temperature. Furthermore, it allows the offset of the first sensor and second sensor (both implemented as a resistor-bridge) to be directly measured. (indeed, under the reference conditions $\Delta\sigma_{iso}=0$ and $\Delta T=0$) by definition.

Consider:

$$\begin{cases} \Delta V1 = V1 - Voffset1, \text{ and} & [6] \\ \Delta V2 = V2 - Voffset2 & [7] \end{cases}$$

where V1 is the (differential voltage) output of the first sensor, V2 is the (differential voltage) output of the second sensor, Voffset1 is the offset of the first sensor (measured under the reference conditions), and Voffset2 is the offset of the second sensor (measured under the reference conditions), as stated above.

The set of two simultaneous equations can then be written as:

$$\begin{cases} V_1 = \sum_{i=0,j=0}^{K} \alpha_{ij}.\Delta\sigma_{iso}^i.\Delta T^j & [8] \\ V_2 = \sum_{i=0,j=0}^{L} \beta_{ij}.\Delta\sigma_{iso}^i.\Delta T^j & [9] \end{cases}$$

where the coefficients $\alpha_{ij}$ and $\beta_{ij}$ are constants, and K, L, i, j are integer values. It can be seen that $\alpha_{00}$=Voffset1, and $\beta_{00}$=Voffset2. In other words, the value of $\alpha_{00}$ and $\beta_{00}$ need not be determined by curve-fitting, but can be "directly measured".

The values of "K" and "L" are known as the "orders" of the polynomial [8] and [9] respectively. The value K may be the same as the value L, or may be different. These values can be chosen by the skilled person, depending on the application, and may depend for example on the required or desired accuracy, taking into account the envisioned temperature and stress range. For envisioned applications, where the temperature range is relative large and the stress range is relative small, the formula [8] for the sensor 21 with the higher temperature sensitivity (assume TS1>TS2) may be chosen to have a higher order "K" than the formula [9] for the other sensor 22, although the present invention is not limited thereto. In each case, the skilled person can easily find a suitable order of the polynomial by using curve-fitting, and calculating the maximum deviation between the fitted curve and the measurements, and if the maximum deviation is larger than desired, increase the order of the polynomial.

The coefficients $\alpha_{ij}$ and $\beta_{ij}$ are stress and temperature independent, but are depending inter alia on the geometry of the sensors, and on the materials used and the doping levels used, which constants may be determined from literature or by simulation or by measurement, or combinations hereof. The coefficients do not depend on the physical dimensions, because a resistor bridge with four equal resistor values is used for both the first and second sensor, hence only the relative dimensions of the individual resistors is important, not their absolute value.

It is a major advantage of using two polynomial expressions because it allows the coefficients to be chosen to fit in the desired operating conditions, and because the set of equations is relatively easy to solve numerically. Stated differently, the coefficients $\alpha_{ij}$ and $\beta_{ij}$ can be determined relatively easily by performing measurements under different stress and temperature conditions, and by applying curve-fitting techniques, using a distance criterium, e.g. least mean square or minimum absolute distance, or any other suitable criterium known in the art. Once the coefficients are determined (e.g. during design-stage or during calibration or a combination of both), they can be stored in non-volatile memory in the device (e.g. in flash or EEPROM).

During actual use of the device, these coefficient values can be read from the non-volatile memory, the values V1 and V2 from each sensor would be measured, and the set of equations can be relatively easily solved numerically by a digital processor which may be embedded in the same device. It is the combination of all these elements: (1) relatively small number of measurements needed to determine the coefficients, thus requiring only limited time and resources during production, (2) relatively small number of coefficients needed, thus requiring only limited storage space in non-volatile memory, (3) relatively simple equations, thus requiring only limited time and processing power in the final device, that makes this solution practically feasible. As far as is known to the inventors, in the prior art, even recent prior art, at least one of these aspects is consistently considered to be a hurdle that cannot be overcome. In particular, some prior art documents (e.g. U.S. Pat. No. 7,980,138B2) seem to suggest that a huge number of measurements (in two variables: stress and temperature) need to be performed, and the results need to be stored in a huge matrix, for direct look-up by the device, quite in contrast with the solution offered by the present invention, which is based on solving a simultaneous set of two equations.

General Examples

In embodiments of the present invention, both polynomials [8] and [9] are fourth-order polynomials (meaning K=4 and L=4), wherein one or more coefficients may be zero.

In embodiments of the present invention, both polynomials [8] and [9] are third-order polynomials (meaning K=3 and L=3), wherein one or more coefficients may be zero.

In embodiments of the present invention, both polynomials [8] and [9] are second-order polynomials (meaning K=2 and L=2), wherein one or more coefficients may be zero. Experiments have shown that fourth order polynomials, third order polynomials, but even second order polynomials can provide highly accurate results over a broad temperature range, e.g. from −20° C. to +150° C., or even from −40° C. to +170° C., and a modest pressure range (e.g. up to +/−200 MPa higher or lower than the reference pressure).

In embodiments of the present invention, both polynomials are second-order polynomials (meaning K=2 and L=2, and $\alpha_{20}$< >0 and $\beta_{20}$< >0), but the coefficients of the cross-terms are set to zero, meaning that: $\alpha_{11}=\alpha_{12}=\alpha_{21}=\alpha_{22}=0$ and $\beta_{11}=\beta_{12}=\beta_{21}=\beta_{22}=0$. This embodiment has the advantage that only eight coefficients need to be determined by curve-fitting.

In embodiments of the present invention, both polynomials are second-order polynomials (meaning K=2 and L=2, and $\alpha_{20}$< >0 and $\beta_{20}$< >0), but the following coefficients are set to zero: $\alpha_{11}=\alpha_{12}=\alpha_{20}=\alpha_{21}=\alpha_{22}=0$, and $\beta_{11}=\beta_{12}=\beta_{20}=\beta_{21}=\beta_{22}=0$. This embodiment has the advantage that only six coefficients need to be determined by curve-fitting.

In embodiments of the present invention, both polynomials are first-order polynomials (meaning K=1 and L=1), which can provide sufficiently accurate results in the range of about 0° C. to about +120° C., or even from about 0° C. to about +140° C.

In embodiments of the present invention, one of the polynomials is a first-order polynomial and the other polynomial is a second order polynomial, meaning K=1 and L=2, or K=2 and L=1.

In embodiments of the present invention, one of the polynomials is a third-order polynomial and the other polynomial is a second order polynomial, meaning K=2 and L=3, or K=3 and L=2.

In embodiments of the present invention, one of the polynomials is a third-order polynomial and the other polynomial is a first order polynomial, meaning K=3 and L=1, or K=1 and L=3.

In embodiments of the present invention, one of the polynomials is a fourth-order polynomial and the other polynomial is a first order polynomial, meaning K=4 and L=1, or K=1 and L=4.

In embodiments of the present invention, one of the polynomials is a fourth-order polynomial and the other polynomial is a second order polynomial, meaning K=4 and L=2, or K=2 and L=4.

In embodiments of the present invention, both polynomials are first-order polynomials, and the coefficients of the cross-terms are zero, thus K=1 and L=1 and $\alpha_{11}=0$ and $\beta_{11}=0$.

Example 1

In a first example, the following set of second order polynomials is used:

$$\begin{cases} \Delta V1 = \alpha_{20}.\Delta\sigma_{iso} \wedge 2 + \alpha_{11}.\Delta\sigma_{iso}.\Delta T + \\ \quad \alpha_{02}.\Delta T \wedge 2 + \alpha_{10}.\Delta\sigma_{iso} + \alpha_{01}.\Delta T \\ \Delta V2 = \beta_{20}.\Delta\sigma_{iso} \wedge 2 + \beta_{11}.\Delta\sigma_{iso}.\Delta T + \\ \quad \beta_{02}.\Delta T \wedge 2 + \beta_{10}.\Delta\sigma_{iso} + \beta_{01}.\Delta T \end{cases} \quad [10]$$
$$[11]$$

As described above, the values of $\alpha_{00}$=Voffset1, $\beta_{00}$=Voffset2, $\alpha_{20}$, $\alpha_{11}$, $\alpha_{02}$, $\alpha_{10}$, $\alpha_{01}$, $\beta_{20}$, $\beta_{11}$, $\beta_{02}$, $\beta_{10}$, $\beta_{01}$ could thus be determined during production (e.g. after packaging or during wafer probing), and would be stored in non-volatile memory in the device.

During actual use of the device, the output V1, V2 of the first and second sensor would be measured, and the set of equations [9], [10] would be solved, e.g. by an iterative approach, or by stepwise approximation, or in any other known manner, yielding a value for $\Delta\sigma_{iso}$ and for $\Delta T$ that satisfy the set of equations. The numerical value of $\Delta\sigma_{iso}$ corresponds to the "true stress" (even after drift), relative to the reference stress and the numerical value of $\Delta T$ corresponds to the "true temperature" relative to the reference temperature. These numerical values can then be used in another formula (see further) for actually compensating the Hall-voltage readout.

Example 2

In a variant of example 1, some of the coefficients are chosen equal to zero, resulting in less coefficients to be determined and stored, and simpler equations to be solved. The set of equations of the second example is:

$$\begin{cases} \Delta V1 = \alpha_{11}.\Delta\sigma_{iso}.\Delta T + \alpha_{02}.\Delta T \wedge 2\alpha_{10}.\Delta\sigma_{iso} + \alpha_{01}.\Delta T & [12] \\ \Delta V2 = \beta_{11}.\Delta\sigma_{iso}.\Delta T + \beta_{02}.\Delta T \wedge 2 + \beta_{10}.\Delta\sigma_{iso} + \beta_{01}.\Delta T & [13] \end{cases}$$

Example 3

The third example is actually the same as the second example, but formulated differently. The main reason of this example is to show that the polynomial representation can also be used to represent "coefficients that are temperature-dependent". The set of equations [11], [12] can be rewritten as:

$$\begin{cases} \Delta V1 = (\alpha_{10} + \alpha_{11}.\Delta T).\Delta\sigma_{iso} + \alpha_{02}.\Delta T \wedge 2 + \alpha_{01}.\Delta T & [14] \\ \Delta V2 = (\beta_{10} + \beta_{11}.\Delta T).\Delta\sigma_{iso} + \beta_{02}.\Delta T \wedge 2 + \beta_{01}.\Delta T & [15] \end{cases}$$

or:

$$\begin{cases} \Delta V1 = \epsilon_1.\Delta\sigma_{iso} + \alpha_{02}.\Delta T \wedge 2 + \alpha_{01}.\Delta T & [16] \\ \Delta V2 = \epsilon_2.\Delta\sigma_{iso} + \beta_{02}.\Delta T \wedge 2 + \beta_{01}.\Delta T & [17] \end{cases}$$

where the value of $\epsilon_1$ and $\epsilon_2$ are not constants, but are actually temperature-dependent values, $\epsilon_1(T)$ and $\epsilon_2(T)$ which could be stored in the non-volatile memory as a list of values, e.g. representing a piece-wise linear approximation.

A possible advantage of this formulation is that this set of equations [16], [17] can again be "solved" by an iterative process, starting from a starting value of $\Delta\sigma_{iso}$ and $\Delta T$, determining corresponding values for $\epsilon_1(T_0)$ and $\epsilon_2(T_0)$, (which are then considered as temporary constants), solving the set of equations (with constant coefficients), resulting in a new set of values $\Delta\sigma_{iso}$ and $\Delta T$, which values may then be used as new starting values, etc.

It shall be clear that the formulation of the present invention can thus also represent temperature-dependent coefficients.

Example 4

As mentioned above, even simpler variants can be formulated by setting particular values to zero. For example, if the coefficients $\alpha 11$ and $\beta 11$ of example 2 (equation [12], [13]) are also set to zero, the set of equations becomes:

$$\begin{cases} \Delta V1 = \alpha_{10}.\Delta\sigma_{iso} + \alpha_{02}.\Delta T \wedge 2 + \alpha_{01}.\Delta T & [18] \\ \Delta V2 = \beta_{10}.\Delta\sigma_{iso} + \beta_{02}.\Delta T \wedge 2 + \beta_{01}.\Delta T & [19] \end{cases}$$

Even this simple set of equations was found to yield highly accurate results in an application that will be discussed further, for compensating a Hall-sensor readout in the temperature range of about 0° C. to about 140° C.

It is an advantage that this set of equations is particularly easy to solve (e.g. by first eliminating the parameter $\Delta\sigma_{iso}$ from the set of equations, and then solving a quadratic equation in the single variable $\Delta T$, and then replacing the value $\Delta T$ in one of the equations to find $\Delta\sigma_{iso}$), but of course other ways to solve the set of equations may also be used. The simplicity of this solution, in combination with its high accuracy, is a major advantage over prior art solutions.

II. Compensation of Stress and Temperature

Above, it was described how a value $\Delta T$ representative for the "true temperature" (as would be obtained from an ideal temperature sensor which is not sensitive to mechanical stress), and a value of $\Delta\sigma_{iso}$ representative for the "true mechanical stress" (as would be obtained from an ideal mechanical stress sensor which is not sensitive to temperature), can be obtained from a first and second sensor which are not ideal, using a set of polynomial equations.

When a particular set of values ($\Delta\sigma_{iso}$ and $\Delta T$) that satisfies the simultaneous set of two equations is found, (and makes technical sense), the amplified and digitized Hall voltage VH can then be corrected for example by using the following formula:

$$VHcomp = VH/CF \quad [20]$$

where CF is a correction factor, which can be expressed by the following M-th order polynomial:

$$CF = \sum_{i=0,j=0}^{M} \gamma_{ij} \cdot \Delta\sigma_{iso}^{i} \cdot \Delta T^{j} \quad [21]$$

where $\Delta\sigma_{iso}$ and $\Delta T$ are the values found above, the coefficients $\gamma_{ij}$ are constants, and M, i, j are integer values. The value of $\gamma_{00}$ may be equal to 1.

The coefficients $\gamma_{ij}$ are stress and temperature independent, but are depending inter alia on the geometry (of the sensor), the materials used and the doping levels used, which constants may be determined from literature or by simulation or by measurement, and on the biasing of the Hall element, e.g. constant current or constant voltage, or combinations hereof. These coefficients are not dependent on the actual dimensions used, because the sensors are implemented as resistor bridges with equal resistor values.

The coefficients $\gamma_{ij}$ can be determined relatively easily by performing measurements, and by applying curve-fitting techniques, using a distance criterium, e.g. least mean square or minimum absolute distance, or any other suitable criterium known in the art. Once the coefficients are known, and a set of values ($\Delta\sigma_{iso}$ and $\Delta T$) are calculated (see above), the expression [21] can be easily calculated.

The value "M" is known as the "order" of the polynomial. This value can be chosen by the skilled person, depending on the application, and may depend for example on the required accuracy and on the envisioned temperature and stress range.

It is pointed out that the order "K" and "L" of the polynomials of the set of equations for calculating the stress $\Delta\sigma_{iso}$ and temperature $\Delta T$, may be, but need not necessarily be the same as the order "M" of the polynomial for compensation. In other words, K, L and M can be chosen independently. Some possible combinations of K, L and M are the following, but the invention is not limited thereto, and other combinations may also be used.

TABLE 1 examples of combinations of K, L, M

| K | L | M |
|---|---|---|
| 1 | 1 | 1 |
| 1 | 1 | 2 |
| 1 | 1 | 3 |
| 1 | 2 | 1 |
| 1 | 2 | 2 |
| 1 | 2 | 3 |
| 1 | 3 | 1 |
| 1 | 3 | 2 |
| 1 | 3 | 3 |
| 2 | 1 | 1 |
| 2 | 1 | 2 |
| 2 | 1 | 3 |
| 2 | 2 | 1 |
| 2 | 2 | 2 |
| 2 | 2 | 3 |
| 2 | 3 | 1 |
| 2 | 3 | 2 |
| 2 | 3 | 3 |
| 3 | 1 | 1 |
| 3 | 1 | 2 |
| 3 | 1 | 3 |
| 3 | 2 | 1 |
| 3 | 2 | 2 |
| 3 | 2 | 3 |
| 3 | 3 | 1 |
| 3 | 3 | 2 |
| 3 | 3 | 3 |

It is pointed out that the formula [21] may also be written as a product of two polynomials, as follows:

$$CF = \sum_{i=0}^{P} \eta_i \cdot \Delta\sigma_{iso}^i \cdot \sum_{j=0}^{Q} v_j \cdot \Delta T^j \qquad [22]$$

but this is merely a different formulation.

GENERAL EXAMPLES

In particular embodiments of the present invention, the polynomial in formula [21] is a second-order polynomial (meaning M=2, and at least one of the second order coefficients is non-zero), which can provide highly accurate results in a temperature range of about −20° C. to about +150° C., or even −40° C. to about +170° C.

In embodiments of the present invention, the polynomial in formula [21] is a second-order polynomial, but the coefficients of the cross-terms are set to zero, meaning that: $\gamma_{11}=\gamma_{12}=\gamma_{21}=\gamma_{22}=0$. This embodiment has the advantage that only four gamma-coefficients need to be determined by curve-fitting (namely: $\gamma_{01}$, $\gamma_{02}$, $\gamma_{10}$, $\gamma_{20}$).

In embodiments of the present invention, the polynomial in formula [21] is a second-order polynomials, but the following coefficients are set to zero: $\gamma_{11}=\gamma_{12}=\gamma_{20}=\gamma_{21}=\gamma_{22}=0$. This embodiment has the advantage that only three coefficients need to be determined by curve-fitting (namely: $\gamma_{01}$, $\gamma_{02}$, $\gamma_{10}$)

In embodiments of the present invention, the polynomial of formula [21] is a first-order polynomial (meaning M=1), which may still provide sufficiently accurate results in the range of about 0° C. to about +120° C., or even from about 0° C. to about +140° C.

In embodiments of the present invention, the polynomial of formula [21] is a first-order polynomial, meaning M=1.

In embodiments of the present invention, the polynomial of formula [21] is a first-order polynomial (thus M=1), and the coefficient of the cross-term is set to zero, meaning that: $\gamma_{11}=0$.

The skilled person can easily find a suitable order of the polynomial by using curve-fitting, and calculating the maximum deviation between the fitted curve and the measurements, and if the maximum deviation is larger than desired, increase the order of the polynomial.

Example 1

In a first example, the following correction factor CF is used:

$$CF=(\gamma_{00}+\gamma_{20}\cdot\Delta\sigma_{iso}^2+\gamma_{11}\cdot\Delta\sigma_{iso}\cdot\Delta T+\gamma_{02}\cdot\Delta T^2+\gamma_{10}\cdot\Delta\sigma_{iso}+\gamma_{01}\cdot\Delta T) \qquad [23]$$

As described above, the values of $\gamma_{00}$, $\gamma_{20}$, $\gamma_{11}$, $\gamma_{02}$, $\gamma_{10}$, $\gamma_{01}$, may be determined during production (e.g. after packaging or after probing), and can be stored in a non-volatile memory, physically connectable or physically embedded in the device.

Example 2

In a variant of example 1, some of the coefficients are chosen equal to zero, resulting in less coefficients to be determined and stored, and a simpler formula to be calculated. The correction factor of the second example is:

$$CF=(\gamma_{00}+\gamma_{11}\cdot\Delta\sigma_{iso}\cdot\Delta T+\gamma_{02}\cdot\Delta T^2+\gamma_{10}\cdot\Delta\sigma_{iso}+\gamma_{01}\cdot\Delta T) \qquad [24]$$

Example 3

The third example is actually the same as the second example, but formulated differently. The main reason of this example is to show that the polynomial representation can also be used to represent "coefficients that are temperature-dependent". The equation [23] can be rewritten as:

$$CF=(\gamma_{00}+(\gamma_{10}+\gamma_{11}\cdot\Delta T)\cdot\Delta\sigma_{iso}+\gamma_{02}\cdot\Delta T^2+\gamma_{01}\cdot\Delta T) \qquad [25]$$

or:

$$CF=(\gamma_{00}+\lambda_1\cdot\Delta\sigma_{iso}+\gamma_{02}\cdot\Delta T^2+\gamma_{01}\cdot\Delta T) \qquad [26]$$

where the value of $\lambda_1$ is not constant, but is temperature-dependent, and can be stored in the non-volatile memory as a list of values, e.g. representing a piece-wise linear approximation, along with the coefficients $\gamma_{ij}$.

From this example it shall be clear that the formulation of the correction factor as a polynomial, can thus also represent temperature-dependent coefficients, even though the coefficients $\gamma_{ij}$ are constants.

Example 4

As mentioned above, even simpler variants of the correction formula can be used, by setting particular values to zero. For example, if the coefficient $\gamma_{11}$ of example 2 is also set to zero, the correction factor becomes:

$$CF = (\gamma_{00} + \gamma_{10} \cdot \Delta\sigma_{iso} + \gamma_{02} \cdot \Delta T^2 + \gamma_{01} \cdot \Delta T) \quad [27]$$

Even this simple set of equations was found to yield highly accurate results in an application that will be discussed further, for compensating a Hall-sensor readout in the temperature range of about 0° C. to about 140° C.

Example 5

As an example of the second formulation (see formula [22]), in an embodiment where P=2 and Q=2, CF could be written as:

$$CF = (\eta_0 + \eta_1 \cdot \Delta\sigma_{iso} + \eta_2 \cdot \Delta\sigma_{iso}^2) \cdot (v_0 + v_1 \cdot \Delta T + v_2 \cdot \Delta T^2) \quad [28]$$

where the coefficients $\eta_i$ and $v_i$ are temperature independent.

Example 6

As yet another example, the polynomial CF could be written as follows:

$$CF = (1 + \delta_{01} \cdot \Delta T + \delta_{02} \cdot \Delta T^2) \cdot [1 + (\delta_{10} + \delta_{11} \cdot \Delta T) \cdot \Delta\sigma_{iso}] \quad [29]$$

where $\delta_{ij}$ are temperature independent coefficients, or as:

$$CF = (1 + \delta_{01} \cdot \Delta T + \delta_{02} \cdot \Delta T^2) \cdot [1 + \lambda_2 \cdot \Delta\sigma_{iso}] \quad [30]$$

where $\delta_{ij}$ are temperature independent coefficients, but $\lambda_2$ is temperature dependent. Each of the values $\delta_{ij}$ can be stored in non-volatile memory as a single coefficient, while $\lambda_2$ can be stored as a list of several coefficients.

Alternative Compensation Formula:

As an alternative to formula [20], which has a division-operation, the compensated Hall voltage can also be approximated using the following formula:

$$VHcomp = VH \times CFb \quad [31]$$

where CFb is a second correction factor, which can be expressed as the following n-th order polynomial:

$$CFb = \sum_{i=0, j=0}^{R} \tau_{ij} \cdot \Delta\sigma_{iso}^i \cdot \Delta T^j \quad [32]$$

where $\Delta\sigma_{iso}$ and $\Delta T$ are the values found above, the coefficients $\tau_{ij}$ are constants, and R, i, j are integer values. The value of $\tau_{00}$ may be equal to 1.

Everything which was said for the formula [21] is also applicable to formula [32], for example, this polynomial may also be formulated as a product of two polynomials, such as for example that in particular embodiments this polynomial may be first, second, third or higher order, and the order R can be chosen independent of K and L (the same table as was mentioned above for sets of (K, L, M) is also applicable for sets of (K, L, R), etc. Using formulas [30] and [31] or particular examples thereof, has the advantage that the division operation can be avoided, and can be replaced by a multiplication operation, which typically requires less processing time.

Lateral Isotropic Resistors:

A question left unanswered so far is: "how to make two sensors having only lateral isotropic resistors with:
  i) (SS1< >SS2), or
  ii) (TS1< >TS2), or
  iii) (SS1< >SS2 and TS1< >TS2).

In view of the polynomial expressions, and understanding that the terms SS1, SS2, TS1, TS2 primarily refer to the first-order coefficient of the terms ($\Delta\sigma_{iso}$) and ($\Delta T$) respectively, thus SS1 refers to (or has a high correlation with) $\alpha_{10}$, SS2 refers to $\beta_{10}$, TS1 refers to $\alpha_{01}$ and TS2 refers to $\beta_{01}$, this condition can now be reformulated as follows:
  i) ($\alpha_{10}$< >$\beta_{10}$), or
  ii) ($\alpha_{01}$< >$\beta_{01}$), or
  iii) ($\alpha_{10}$< >$\beta_{10}$) and ($\alpha_{01}$< >$\beta_{01}$).

Or stated in a mathematical terms: the set of equations need to be "independent". In practice this boils down to stating that the ratio $\alpha_{10}/\alpha_{01}$ must be different from the ratio $\beta_{10}/\beta_{01}$, e.g. by at least a factor 1.1, preferably at least a factor 1.5.

In preferred embodiments of the present invention this can be achieved by using a so called "resistor-L" layout (single-L or double-L as will be described further) and by using at least three (optionally four) different "materials" for the resistors of the two sensors. With "material" is meant not only the chemical composition (such as Silicon+Boron) but also includes the doping concentration. Some examples of resistors implemented in different "materials" are:
  a p-poly resistor,
  a p-well resistor (with a particular doping level),
  an n-well resistor (with a particular doping level),
  a highly doped p-type resistor, also referred to herein as "p-diff resistor",
  a highly doped n-type resistor, also referred to herein as "n-diff resistor",
  etc.

Turning now to the Figures.

FIG. 1 shows a block-diagram of a first embodiment of a device 100 according to the present invention. It comprises:
  a Hall element 11. In the example shown the Hall element (in the form of a Hall plate) has a "cross" shape and is biased with a constant current or a constant voltage applied to two opposite sides, but that is not required for the present invention, and any other suitable shape, such as for example a square, with a biasing current or voltage applied to its corners, can also be used;
  a first sensor 21, also referred to herein as "temperature sensor" 21 even though it need not be a "pure" (or ideal or near-ideal) temperature sensor with zero or near-zero sensitivity to stress. According to the present invention the first sensor 21 has a temperature sensitivity TS1 quite different from zero, e.g. of at least 1.0 mV/K, and has a stress sensitivity SS1 which may or may not be close to zero (e.g. smaller or larger than or equal to 20 mV/GPa);
  a second sensor 31, also referred to herein as "stress sensor" 31, even though it need not be a "pure" (or ideal or near-ideal) stress sensor with zero or near-zero sensitivity to temperature. According to the present invention the second sensor 31 has a stress sensitivity SS2 quite different from zero, e.g. of at least 100 mV/GPa, and has a temperature sensitivity TS2 which may or may not be close to zero (e.g. smaller or larger than or equal to 0.10 mV/K);

switching means 12 for applying a spinning current or a spinning voltage to the Hall element, in a manner known in the art. The switching means 12 of the device 100 shown in FIG. 1 is further adapted for selectively connecting one of an output of the Hall element, and an output of the first sensor 21, and an output of the second sensor 31 to an input of the amplifier 13;

a differential amplifier 13, configured for amplifying the differential signal coming from the switching means 12;

an analog-to-digital convertor 14 (ADC) for selectively digitizing the amplified Hall signal and the amplified first sensor signal and the amplified second sensor signal;

a controller, e.g. micro-processor or a DSP (Digital Signal Processor) or the like, configured for receiving the digitized values from the ADC 14, and configured for controlling the switching means 12. The controller is connected to a memory 16, which may comprise non-volatile memory (such as ROM, FLASH or EPROM) and volatile memory such as RAM. The non-volatile memory comprises calibration data about the device 100, such as e.g. the offset values Voffset1, Voffset2, and the constants $\alpha_{ij}$, $\beta_{ij}$, $\gamma_{ij}$, or depending on which formula is used, $\delta_{ij}$, $\nu_i$, $\eta_i$ and/or optionally (in some embodiments) a (small) list of values for $\epsilon_1$, $\epsilon_2$, $\lambda_1$, $\lambda_2$ for at least two different temperatures, e.g. by means of a short list representing a staircase-function, or a piece-wise linear approximation, or piece-wise quadratic approximation, depending on which equations are being used.

With "constant current" or "constant voltage" is meant a current or voltage which is temperature compensated. Constant current sources and constant voltage sources are known in the art, and hence need not be further described here. Biasing with a constant voltage is preferred over biasing with a constant current, because it yields a larger signal-to-noise ratio over the entire temperature range.

The controller has a calculation unit configured to calculate a value of the temperature, e.g. a stress-free temperature: "ΔT" and the value of a stress, e.g. a temperature-free stress "$\Delta\sigma_{iso}$" by solving any of the sets of equations described above (in relation to Formulae [1] to [19]), and for compensating the (optionally spinned and/or amplified) Hall signal by using the formula [20] to [30] or by using the formula [31] and [32], or variants thereof. This can be implemented in hardware (e.g. as an ASIC or programmable logic) or as a software program on a programmable processing unit, in manners known per se in the art. One or more of the coefficients used in the formulae may be hardcoded (e.g. in the program) or may be loaded (as parameter or variable) from non-volatile memory. For example, the offset-values Voffset1 and Voffset2 would probably be different for each individual device, and would need to be stored in non-volatile memory (during calibration) and retrieved from said memory (during actual use of the device), but some or all of the other coefficients of the set of polynomials could be hardcoded if process-parameters would show a sufficiently small spread. Alternatively, all the coefficients may be determined during the production stage, for each individual device, and stored in non-volatile memory.

The device 100 is preferably implemented as an integrated semiconductor circuit, in particular a CMOS wafer using a so called (100) crystallographic silicon substrate. Of course, the integrated circuit may have further functionality, for example may have multiple Hall elements arranged for measuring a magnetic field at multiple locations, and the controller 15 or another controller (not shown in FIG. 1) may for example be adapted for calculating an angular position. But of course, this is merely an example, and the invention is not limited to angular position sensors, but can be used in many other applications as well, for example compass applications and magnetometers.

In a variant of FIG. 1 (not shown), the device 100 does not contain a single Hall element the nodes of which are switched for applying the "spinning current" technique, but contains for example four interconnected Hall elements, as described in WO2015067675(A1), for obtaining an offset-compensated Hall value.

Figure 2:
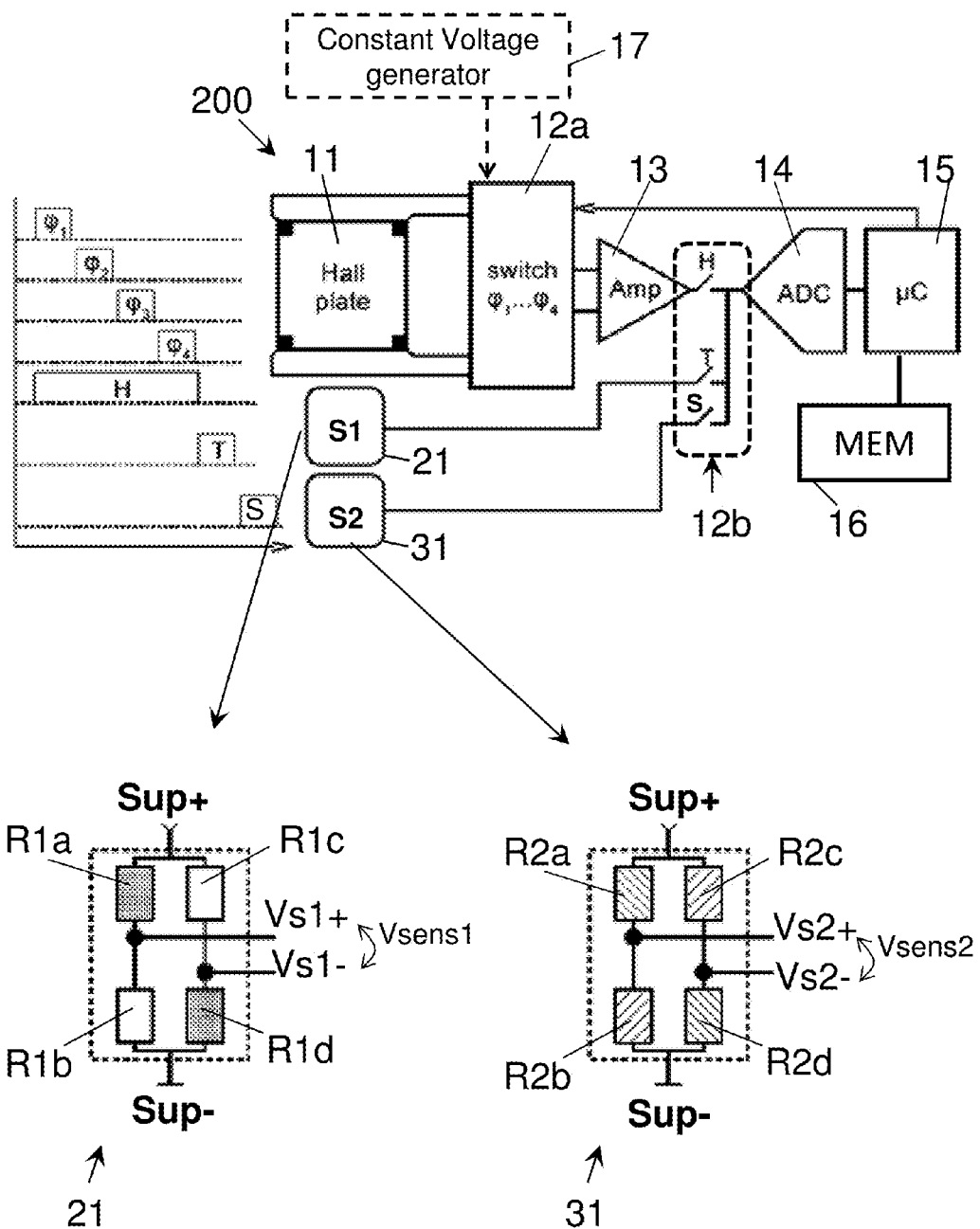
FIG. 2 (top) shows a variant of the exemplary device of FIG. 1, and FIG. 2 (bottom) shows an exemplary embodiment of the two sensors in more detail, namely each being implemented as resistor bridges.

FIG. 2 shows a second embodiment of a device 200 according to the present invention, which is a variant of the device 100 shown in FIG. 1, where the switching means has a first part 12a configured for applying a spinning current or voltage to the Hall elements and for reading the corresponding plate outputs, and a second part 12b for applying an output from the Hall element 11, or the first sensor 21 or the second sensor 31 to the ADC 14 for digitization. As can be seen, in this embodiment the values obtained from the sensors are not amplified before digitization, while the value obtained from the Hall element is. FIG. 2 also shows (on the left of the top figure) a possible timing diagram, showing that the Hall element 11 may be read-out four times, (e.g. for applying the spinning current technique) then the first sensor 21, then the second sensor 31, but of course other timing schemes may also be used, assuming e.g. that the change rates of temperature or mechanical stress are lower than that of the magnetic field.

In a variant of FIG. 2, the amplifier 13 is omitted. This is possible for example by directly digitizing the signal from the Hall plate 11 (e.g. if the digitizer 14 has sufficient accuracy) or is possible for example if the switching circuit 12a provides sufficient amplification itself.

FIG. 2 (bottom left) shows that the first sensor 21 is composed of four resistors configured in a bridge circuit, supplied with a supply voltage Sup+ (which may be equal to the supply voltage VDD of the chip, but that is not absolutely required). According to an essential aspect of the invention, each of the resistors R1a, R1b, R1c, R1d, R2a, R2b, R2c, R2d are "lateral resistors" (not vertical resistors), and each of these resistors is substantially isotropic, e.g. isotropic to in-plane normal mechanical stress.

Preferably the electrical resistance value of each of the four resistors R1a, R1b, R1c, R1d is substantially the same (e.g. designed to be the same at the reference temperature $T_{ref}$ and the reference mechanical stress $\sigma_{ref}$), in which case there would be no offset voltage between VS1+ and VS1−, but that is not absolutely necessary, and the circuit will also work when the electrical resistance of R1a=R1d and R1b=R1c, but R1a<>R1b, but in this case there may be a relatively large offset, which may limit the amplification of the signal, and is therefore better avoided.

The resistor R1a and R1d are made of a first material and the resistor R1b and R1c are made of a second material different from the first material (e.g. having different chemical elements, or having a substantially different doping level, or both) and hence the entire bridge 21 as a whole has a first temperature sensitivity TS1 and a first stress sensitivity SS1, inter alia depending on the first material and second material.

Likewise, FIG. 2 (bottom right) shows that the second sensor 31 is composed of four resistors R2a to R2d configured in a bridge, and supplied with a bias voltage Sup+, which may be equal to the supply voltage VDD of the complete device, e.g. the chip (for example 3.3V), and the resistors R2a, R2d are made of a third material, and the resistors R2b, R2c are made of a fourth material, and hence the entire bridge 31 has a second temperature sensitivity TS2 and a second stress sensitivity SS2, inter alia depending on the third material and fourth material.

By choosing at least three of the four materials to be different (e.g. p-well or n-well or p-diff (=highly p-doped) or n-diff (=highly n-doped) or p-poly (=p-type polycrystalline) or n-poly (=n-type polycrystalline), the first and second lateral isotropic sensor 21, 31 can be designed so as to have:
  i) a different sensitivity to stress (SS1< >SS2), or
  ii) a different sensitivity to temperature (TS1< >TS2), or
  iii) a different sensitivity to both stress and temperature (SS1< >SS2 and TS1< >TS2).
  iv) or stated in a mathematically more precisely way: such that the ratio $\alpha_{10}/\alpha_{01}$ is different from the ratio $\beta_{10}/\beta_{01}$).

It is of course also possible to choose all four materials to be different.

Figure 3:
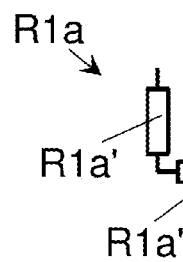
FIG. 3 shows an example of a "resistor-L" having two p-poly resistor strips.

FIG. 3 shows an example of a so called lateral "resistor-L", i.e. two resistor strips R1a', R1a" connected in series and oriented at 90° relative to each other, and having the same resistance. Such a resistor R1a is isotropic to in-plane stress. In the example shown, both strips are made of "p-poly" material, and together they form an example of a "lateral isotropic resistor" R1. The sensitivity of this resistor R1 to in-plane mechanical stress is $4.9 \times 10^{-11}$ per Pa (also written as 4.9E-11 per Pa).

But lateral isotropic resistors can also be made from other materials, for example two strips of "p-diff" (i.e. silicon highly doped with a p-type dopant) or two strips of "n-diff" (i.e. silicon highly doped with an n-type dopant), and the temperature dependence and stress dependence of each such resistor would be different. According to embodiments of the present invention, each of the four resistors R1a, R1b, R1c, R1d are isotropic resistors, e.g. implemented as an in-plane resistor-L structure. Hence, when building a resistive sensor by arranging two pairs of such resistors in a bridge, the sensor 21 itself is a lateral isotropic resistive sensor having a particular temperature and stress sensitivity. A device according to the present invention uses two lateral isotropic resistive bridges.

Figure 4:
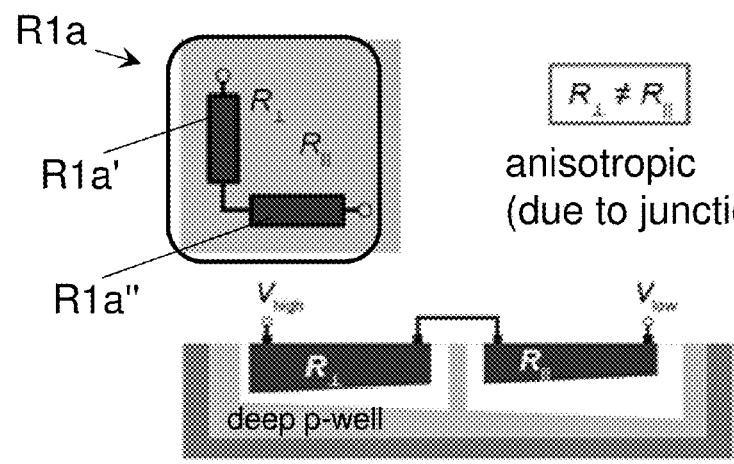
FIG. 4 shows an example of a "resistor-L" having two n-well resistor strips.

FIG. 4 shows another example of a lateral resistor R1a, consisting of two lateral resistor strips R1a', R1a" connected in series and oriented at 90° so as to form a "resistor-L", but in this example the resistor strips are made as n-well resistors. This resistor R1 is however not considered to be "isotropic", because of the junction field effect (illustrated at the bottom of FIG. 4), due to the non-constant thickness of the depletion layer due to the voltage drop over the resistors. The same is true also for p-well resistor strips inside a deep n-well.

Figure 5:
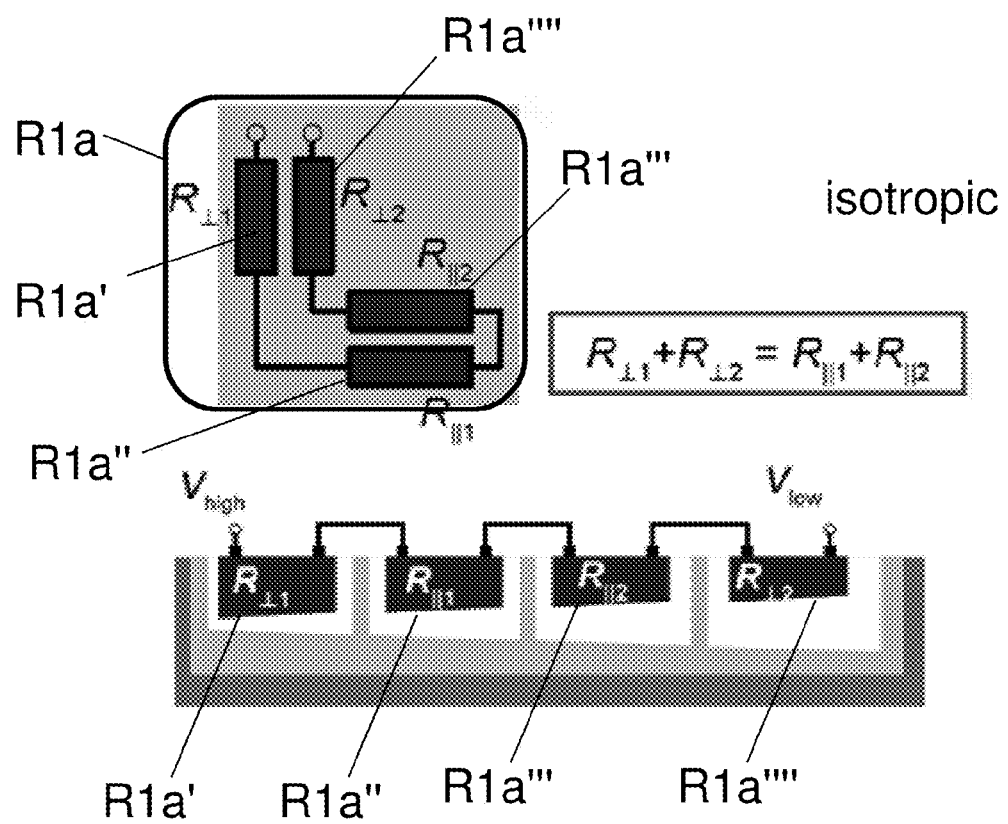
FIG. 5 shows an example of a "double-resistor-L" having four n-well resistor strips.

However, FIG. 5 shows that when four resistor strips are connected in series and arranged so as to form a double-L (e.g. as shown), the combined resistor R1 is isotropic, because R1a'+R1a""=R1a"+R1a'". The stress sensitivity of such a resistor R1a made of p-well resistor strips (e.g. having a doping level of about 1E16 . . . 1E17 per cm$^3$) is about $2.7 \times 10^{-11}$ per Pa (also written as: 2.7E-11 per Pa). The same principle is true for n-well resistor strips inside a p-substrate or a deep p-well, but not with the same values. The piezoresistive coefficient for an n-well L-shape resistor is about −24E-11 per Pa. Thus, a lateral isotropic resistor can also be formed comprising or consisting of four n-well resistor strips.

FIG. 3 to FIG. 5 thus illustrate several examples of how a "lateral isotropic resistor" can be made from different materials, for example but not limited to: p-poly, n-poly, p-diff, n-diff, p-well or n-well.

Figure 6:
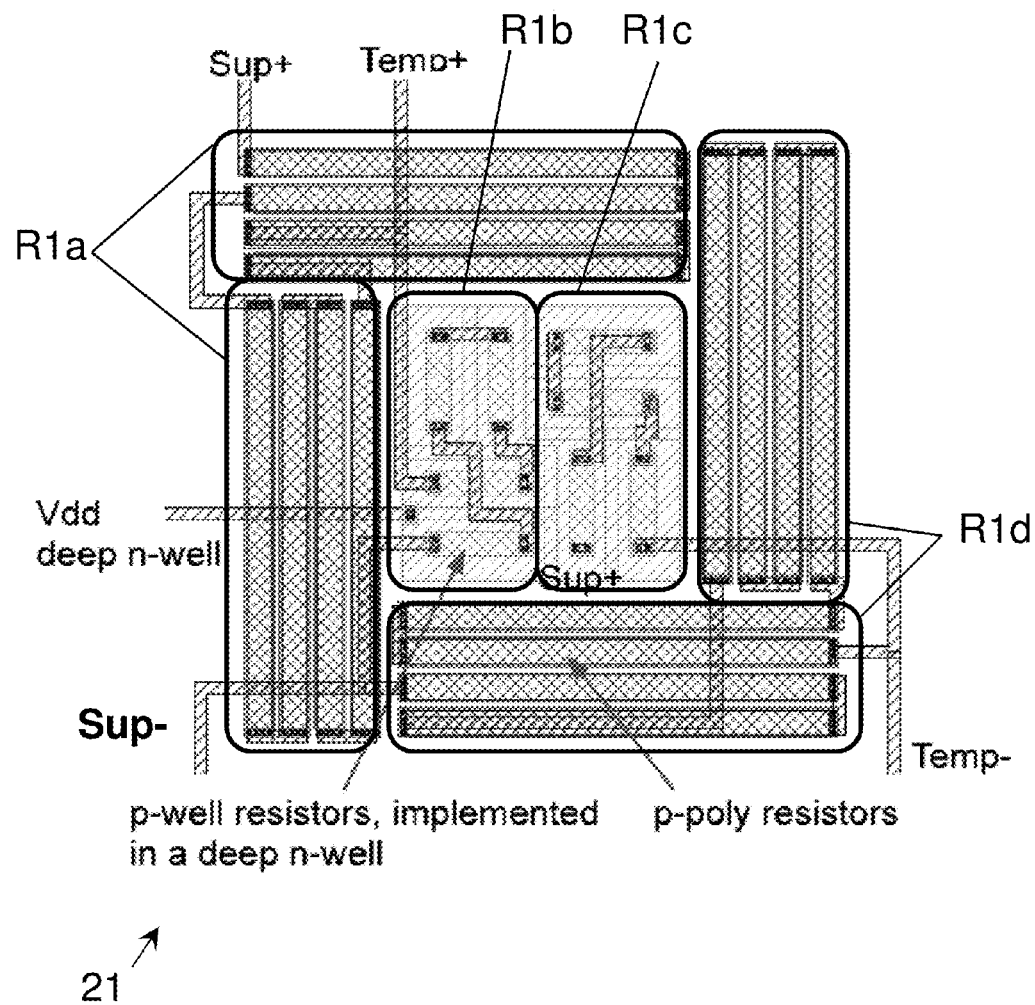
FIG. 6 shows an example of a "first sensor", also referred to herein as "Temperature sensor", even though it may be very stress-dependent.

Referring now back to FIG. 2 (bottom left), the first lateral isotropic sensor 21 (also referred to herein as "temperature sensor") can thus be made by arranging four lateral isotropic resistors R1a, R1b, R1c, R1d in a bridge, wherein for example R1a and R1d can each be made of a double-L with four p-well resistor strips, and R1b and R1c can each be made of a single-L with two p-poly resistor strips, and the result could be a first sensor 21 having a temperature sensitivity TS1 of about 3.9 mV/K (at 25° C., 3.3V supply), and a stress sensitivity SS1 of about 28 mV/GPa at 25° C., 3.3V voltage supply, and some higher order terms. An example of a possible layout of such a first sensor 21 is shown in FIG. 6, where the node Temp+ corresponds to V1+ of FIG. 2, and the node Temp− corresponds to V1− of FIG. 2, together forming the differential output nodes of the first sensor, also referred to herein as "temperature sensor", even though the first sensor may be highly sensitive to mechanical stress.

Referring back to FIG. 2 (bottom right), the second sensor 31 (also referred to as "stress sensor") can for example be made of two lateral isotropic resistors R2a and R2d implemented inside an n-well, and the two lateral isotropic resistors R2b and R2c can be made for example of a single-L with two n-diff resistor strips, resulting in a second sensor 31 (also referred to herein as "stress sensor") having a temperature sensitivity TS2 of about 0.2 mV/K and a stress sensitivity SS2 of about 158 mV/GPa (at 25° C., 3.3V supply), and some higher order terms.

Figure 7:
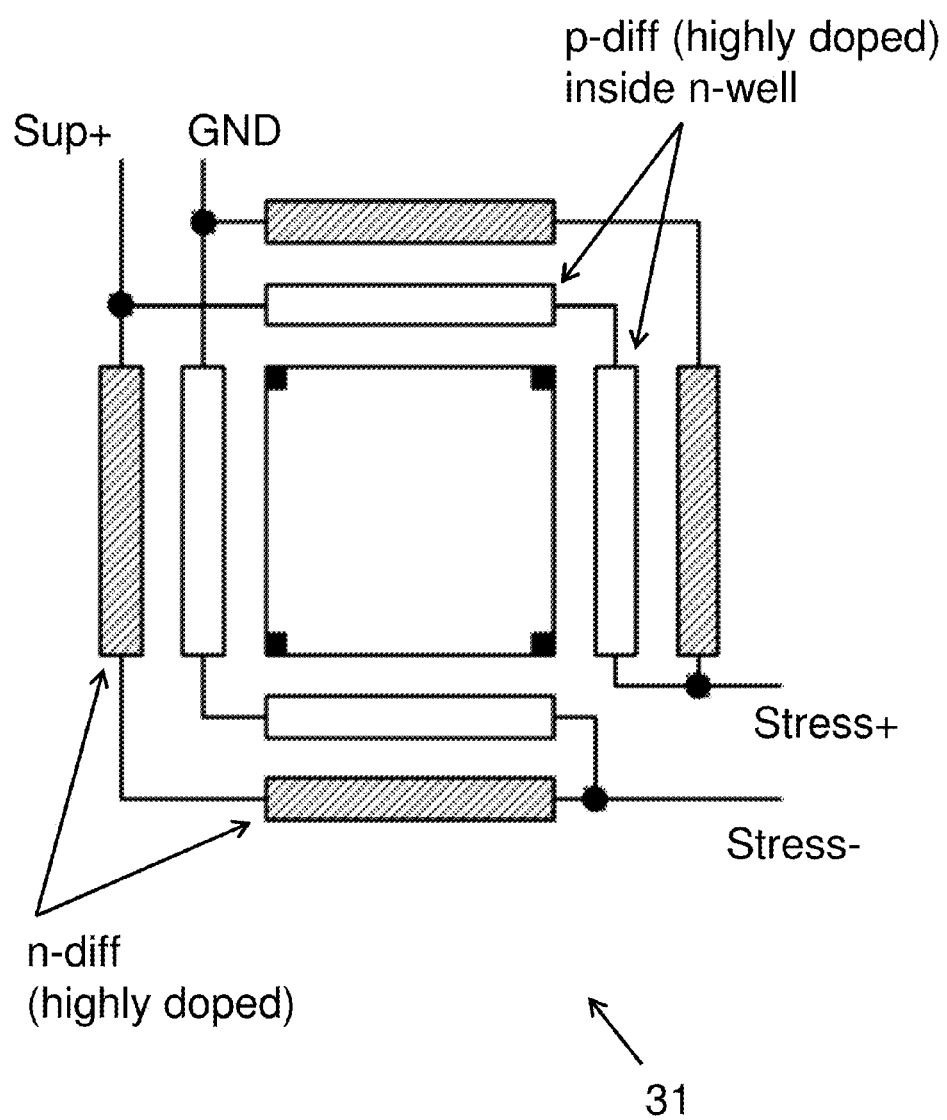
FIG. 7 shows an example of a "second sensor", also referred to herein as "Stress sensor", even though it may be very temperature-dependent. In the example shown, the sensor is arranged around a Hall element, although that is not absolutely required for the invention to work.

An example of a possible layout of such a second sensor 31 is shown in FIG. 7, where the resistor strips of the sensor are arranged around a Hall element (not part of the second sensor), and where the node Stress+ corresponds to V2+, and the node Stress− corresponds to V2− of FIG. 2. The sensor is biased by a voltage Sup+ which may be the same as the supply voltage VDD (for example 3.3V) of the device, but that is not absolutely necessary.

Figure 8:
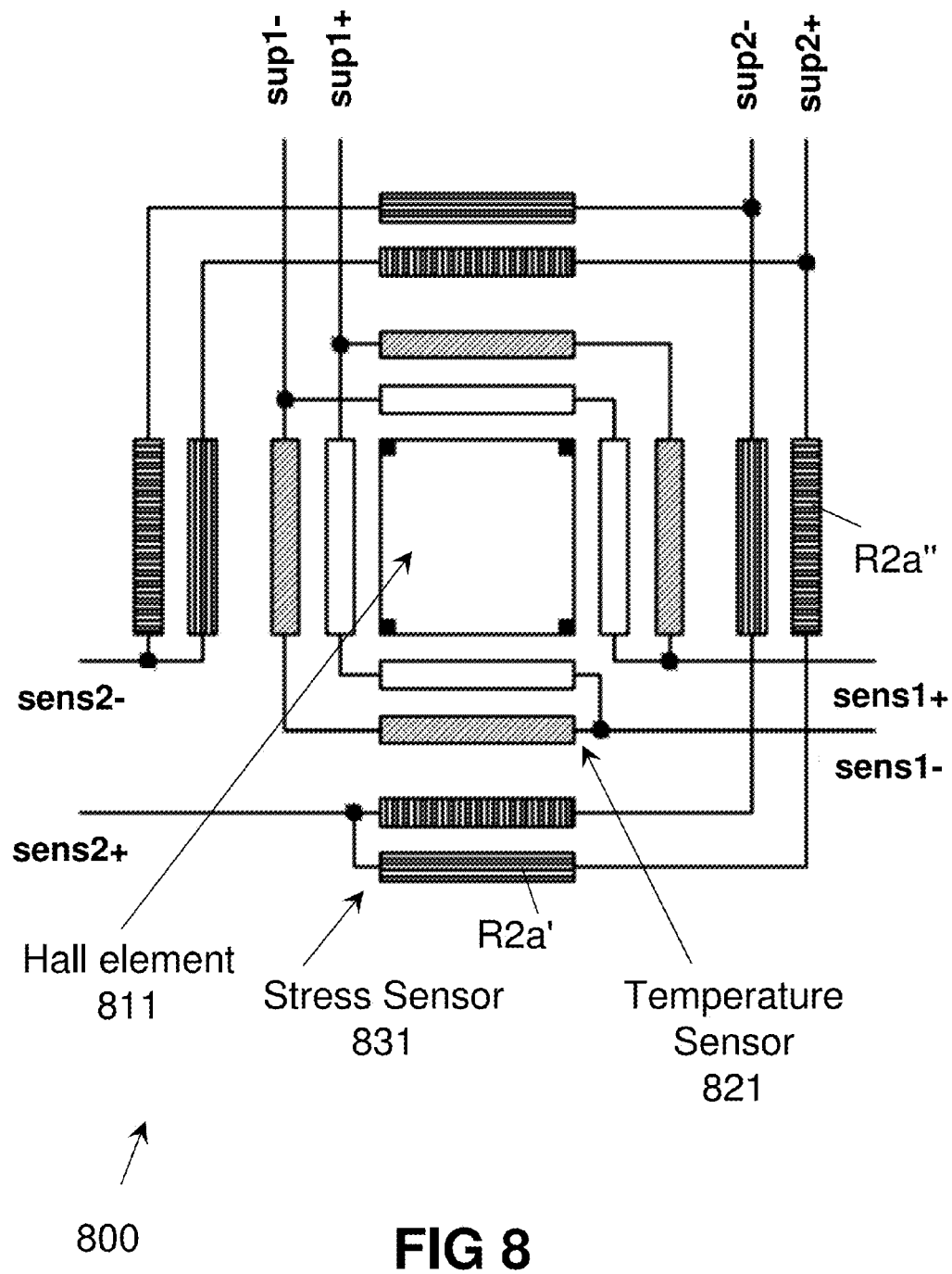
FIG. 8 shows an example of a device according to the present invention, where the first sensor (also referred to herein as "temperature sensor") and the second sensor (also referred to herein as "stress sensor") are both arranged around a Hall element, and wherein each resistor of both sensor elements has two resistive strips arranged in a single L.

FIG. 8 shows an example of a (part of a) device 800 according to an embodiment of the present invention, comprising a Hall element, e.g. a square Hall plate, and a first sensor 821 (temperature sensor) and a second sensor 831 (stress sensor) which are both arranged around the Hall element. In the example shown, each resistor (of both sensors) consists of two resistor-strips, like R2a', R2a", together forming a resistor-L. The shading is used to indicate strips made of the same material. As can be seen, four different materials are used in the example of FIG. 8, but that is not absolutely required, and the invention would also work if three different materials were used. The first resp. second sensor 821, 831 are biased by (Sup1+, Sup1−) and (Sup2+, Sup2−) voltages respectively, which may be the same, or may be different supply voltages. The first sensor is supplied with a first supply voltage sup1, and the second sensor is supplied with a second supply voltage sup2, which may be the same or different from the first supply voltage sup1. Preferably the biasing voltage for biasing the Hall element is the same as the first supply voltage sup1 and the second supply voltage sup2, although that is not absolutely required.

Figure 9:
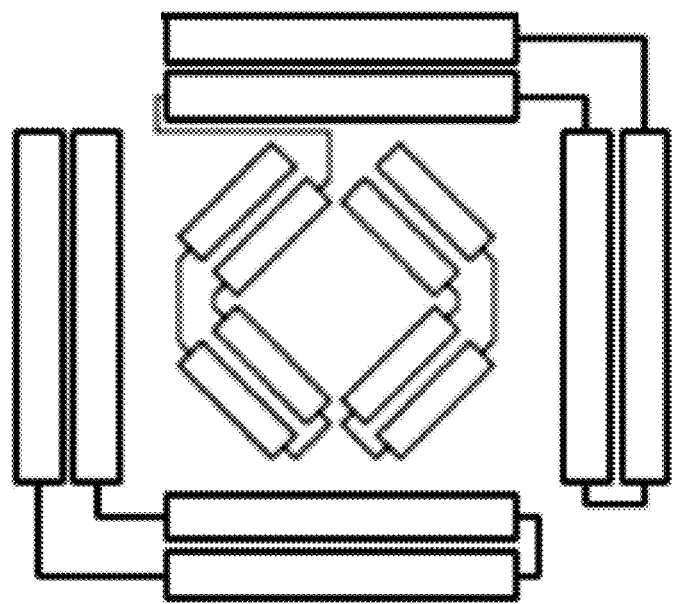
FIG. 9 shows an example of a possible alternative layout for any of the first sensor (temperature sensor) and the second sensor (stress sensor) as can be used in embodiments of the present invention, wherein the sensors may or may not surround a Hall element.

FIG. 9 shows an example of a resistor arrangement for the first or second sensor using double-L resistors, wherein one of the two used materials is arranged to form resistor strips at 45 deg angles. This could be an advantage for the matching of the resistor segments.

Figure 10:
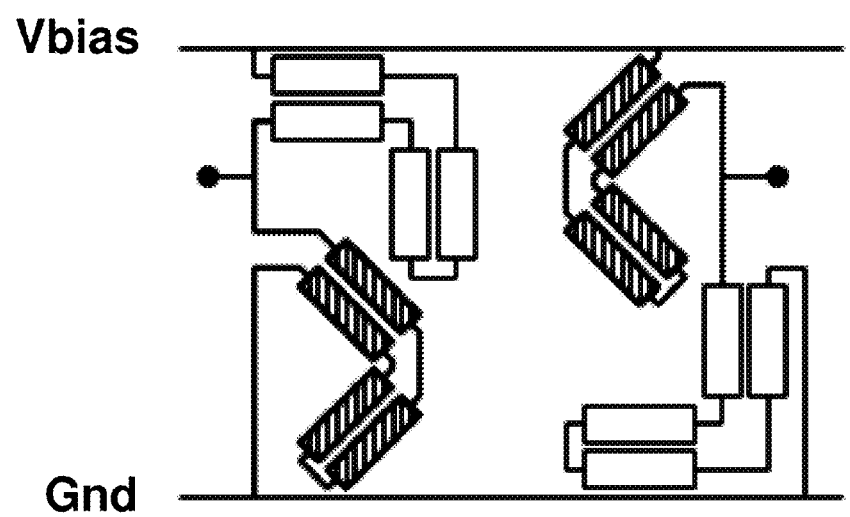
FIG. 10 shows the electrical equivalent circuit of the layout of FIG. 9.

FIG. 10 shows the electrical equivalent of the layout structure of FIG. 9.

Figure 11:
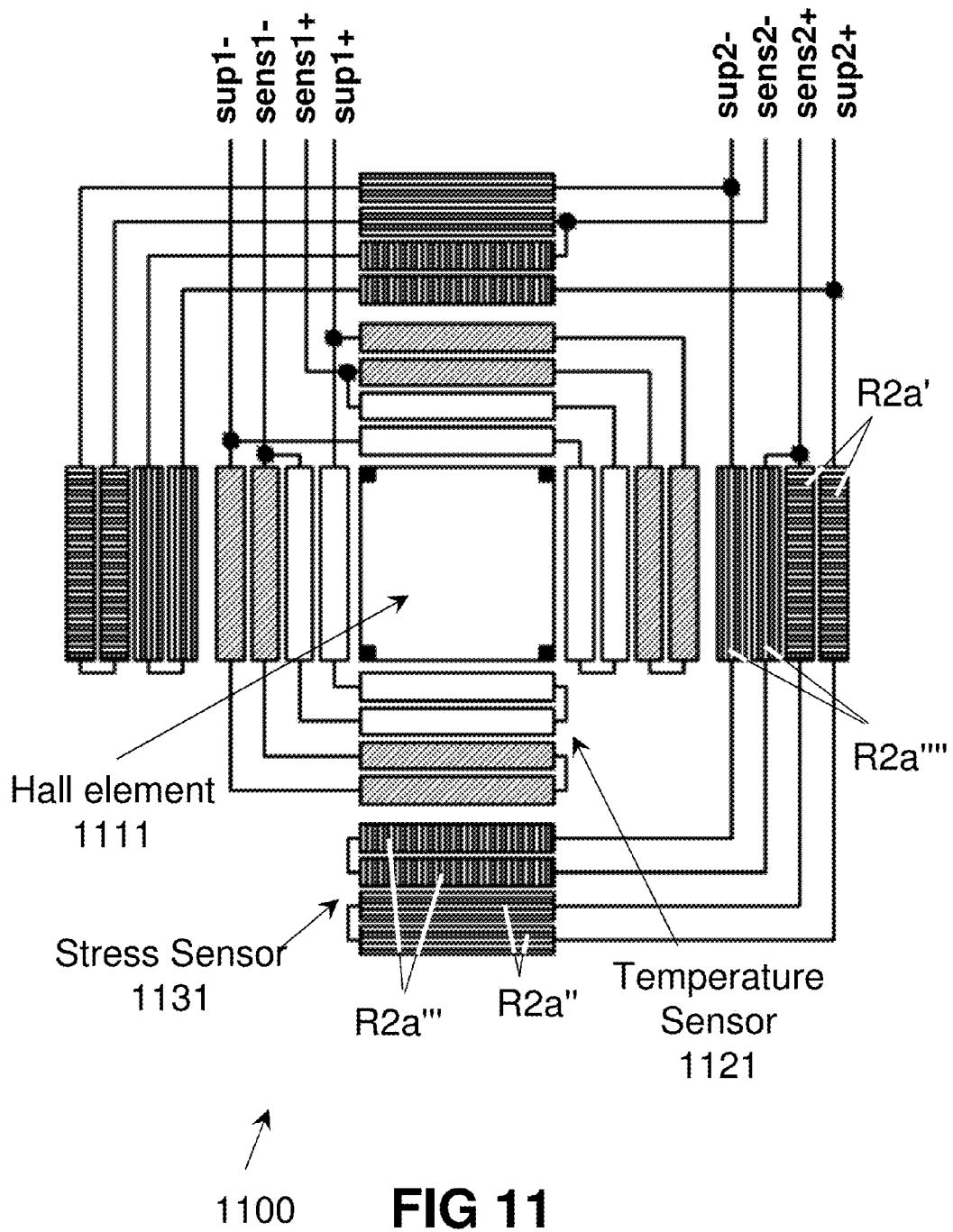
FIG. 11 shows another example of a device according to the present invention, where the first sensor (temperature sensor) and the second sensor (stress sensor) are both arranged around a Hall element, and wherein each resistor has four resistive strips arranged in "double-L".
Figure 12:
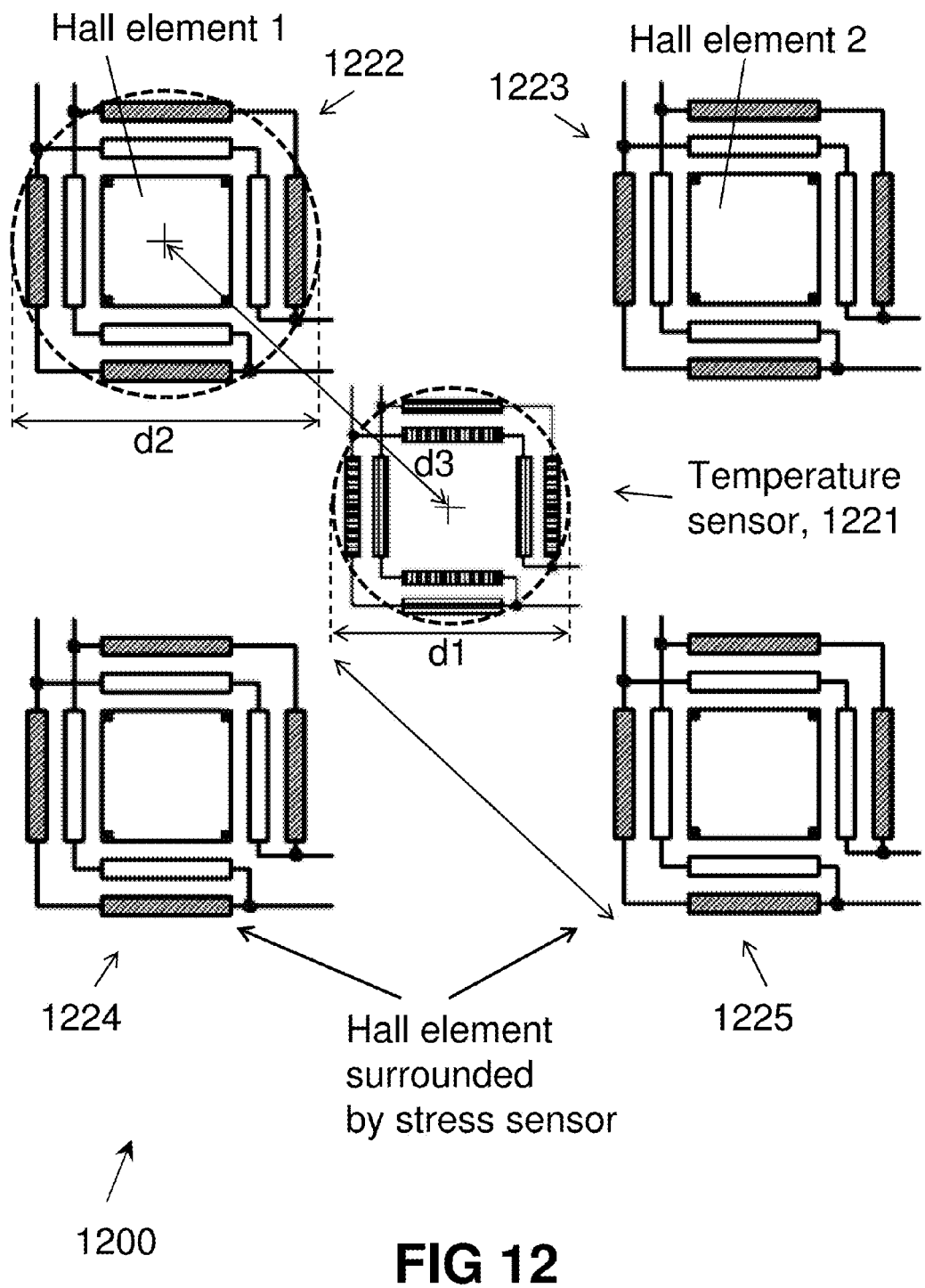
FIG. 12 shows an example of an integrated semiconductor device according to an embodiment of the present invention, having four Hall elements, a single (common) first sensor (acting primarily as temperature sensor) and four second sensors (acting primarily as stress sensors). Each Hall element is surrounded by one stress sensor. In this embodiment, the temperature sensitivity of the first sensor is preferably larger (in absolute value) than the temperature sensor of each of the second sensors, and the pressure sensitivity of each of the second sensors is preferably larger (in absolute value) than the pressure sensitivity of the first sensor.

FIG. 11 shows an example of a device 1100 according to an embodiment of the present invention, comprising a Hall element 1111, e.g. a square Hall plate, and a first sensor 1121 (temperature sensor) and a second sensor 1131 (stress sensor) which are both arranged around a single Hall element. In the example shown, each resistor (of both sensors) consists of four resistor-strips, like R2$a'$, R2$a''$, R2$a'''$, R2$a''''$ together forming a resistor-L. The shading is used to indicate strips made of the same material. As can be seen, four different materials are used in the example of FIG. 11, but that is not absolutely required, and the invention would also work if only three different materials were used. The first resp. second sensor 1121, 1131 are biased by (Sup1+, Sup1−) and (Sup2+, Sup2−) voltages respectively, which may be the same as (Vdd, Gnd), but that is not absolutely required.

In FIG. 8 all resistors have two resistor strips, and in FIG. 11 all resistors have four resistor strips, but a mix wherein the resistors of one sensor has two strips, and the resistors of the other sensor has four strips, is also possible.

It is even possible that one sensor has two resistors with only two resistor strips, and two resistors with four resistor strips. Other variants are possible, as will be discussed in relation to FIG. 17.

FIG. 12 shows an example of part of an integrated circuit comprising four Hall elements, a single (common) first sensor 1221 (referred to as "temperature sensor") and four second sensors (referred to as "stress sensors") each being arranged around one of the four different Hall elements. In this embodiment, the output of each of the four Hall elements could be compensated by calculating the "temperature-free stress" $\Delta\sigma_{iso}$ and "stress-free temperature" $\Delta T$ for each Hall element individually by solving one of the sets of equations described above using the value Vsens1 obtained from the temperature sensor and the value Vsens2 of the particular stress sensor located around the particular Hall element, and by applying the formula [19] or [21] for compensating the sensitivity of the Hall output voltage measured from that particular Hall element.

In an alternative embodiment (not shown), the integrated circuit has an arrangement similar to that of FIG. 12, but the central sensor acts primarily as stress sensor, and the four other sensors, each arranged around a Hall element, act primarily as temperature sensor. With "acts primarily as stress sensor" is meant that the stress sensitivity SS1 of sensor 1221 is larger (in absolute value) than the stress sensitivity SSi of each of the sensors 1222, 1223, 1224, 1225. Likewise, with "acts primarily as temperature sensor" is meant that the temperature sensitivity TSi of the sensors 1222, 1223, 1224, 1225 is larger (in absolute value) than the temperature sensitivity TS1 of the sensor 1221.

Depending on the temperature gradient and stress gradient, the embodiment of FIG. 12, or the alternative embodiment (not shown) may provide more accurate results. Of course, even better results could be obtained if each Hall element has its own, local stress sensor and its own, local temperature sensor (as shown in FIG. 11).

Real Implementation:

In a real implementation of the present invention (the layout of which is not shown, but is similar to that of FIG. 11), the Hall element had a size of about 40 μm×40 μm, and the first sensor (temp sensor) was made of resistor strips of p-well and p-poly, and the second sensor (stress sensor) was made of resistor strips of p-diff and n-diff. For this particular implementation, the following set of equations of the first and second sensor were found:

$$\begin{cases} \Delta V1 = (40 \text{ mV/GPa}).\Delta\sigma_{iso} + (2.0 \text{ mV/K}).\Delta T + (5 \text{ μV/K}^2).\Delta T^2 & [33] \\ \Delta V2 = (158 \text{ mV/GPa}).\Delta\sigma_{iso} + (0.2 \text{ mV/K}).\Delta T - (1 \text{ μV/K}^2).\Delta T^2 & [34] \end{cases}$$

and the following correction factor CF was found for Hall sensors supplied with constant current:

$$CF = [1.0 + (4E\text{-}10)\cdot\Delta\sigma_{iso} - (2E\text{-}13)\cdot\Delta\sigma_{iso}\cdot\Delta T + \\ (1E\text{-}3)\cdot\Delta T + (5E\text{-}6)\cdot\Delta T^2 + (14E\text{-}16)\cdot\Delta\sigma_{iso}\cdot\Delta T^2 - \\ (3E\text{-}18)\cdot\Delta\sigma_{iso}\cdot\Delta T^3] \quad [35]$$

(whereby the coefficients are normalized to Pascal and to Kelvin).

It is noted that some higher order terms may be ignored, if desired, especially if ($\Delta T$) is small.

But of course, this is merely an example, and when other materials and/or geometry is chosen, the values would differ from this example.

Multiple Hall Elements:

In a practical implementation, several arrangements of one or more Hall elements, and one or more temperature sensor and one or more stress sensors are possible, for example:

1) Single Hall element, single temperature sensor, single stress sensor; all at discrete locations on the chip (e.g. not in the immediate vicinity of the Hall element),
2) Single Hall element, single temperature sensor, single stress sensor; the temperature sensor is arranged around the Hall element, the stress sensor is at a discrete location on the chip (e.g. not in the immediate vicinity of the Hall element),
3) Single Hall element, single temperature sensor, single stress sensor; the stress sensor is arranged around the Hall element, the temperature sensor is at a discrete location on the chip (e.g. not in the immediate vicinity of the Hall element),
4) Single Hall element, single temperature sensor, single stress sensor; both temperature sensor and stress sensor are arranged around the Hall element. (e.g. FIG. 8 and FIG. 11),
5) Plurality of Hall elements, single temperature sensor, single stress sensor,
6) Plurality of Hall elements, plurality of temperature sensors, single stress sensor,
7) Plurality of Hall elements, single temperature sensor, plurality of stress sensors (as shown in (e.g. FIG. 12),
8) Plurality of Hall elements, plurality of temperature sensors, plurality of stress sensors,
9) A single Hall element, with a plurality of temperature sensors, and a plurality of stress sensors.

In case of a plurality of Hall elements, these may be arranged in a matrix, or on the circumference of a virtual circle (as is typically the case for an angular position sensor), or in any other way.

Figure 13:
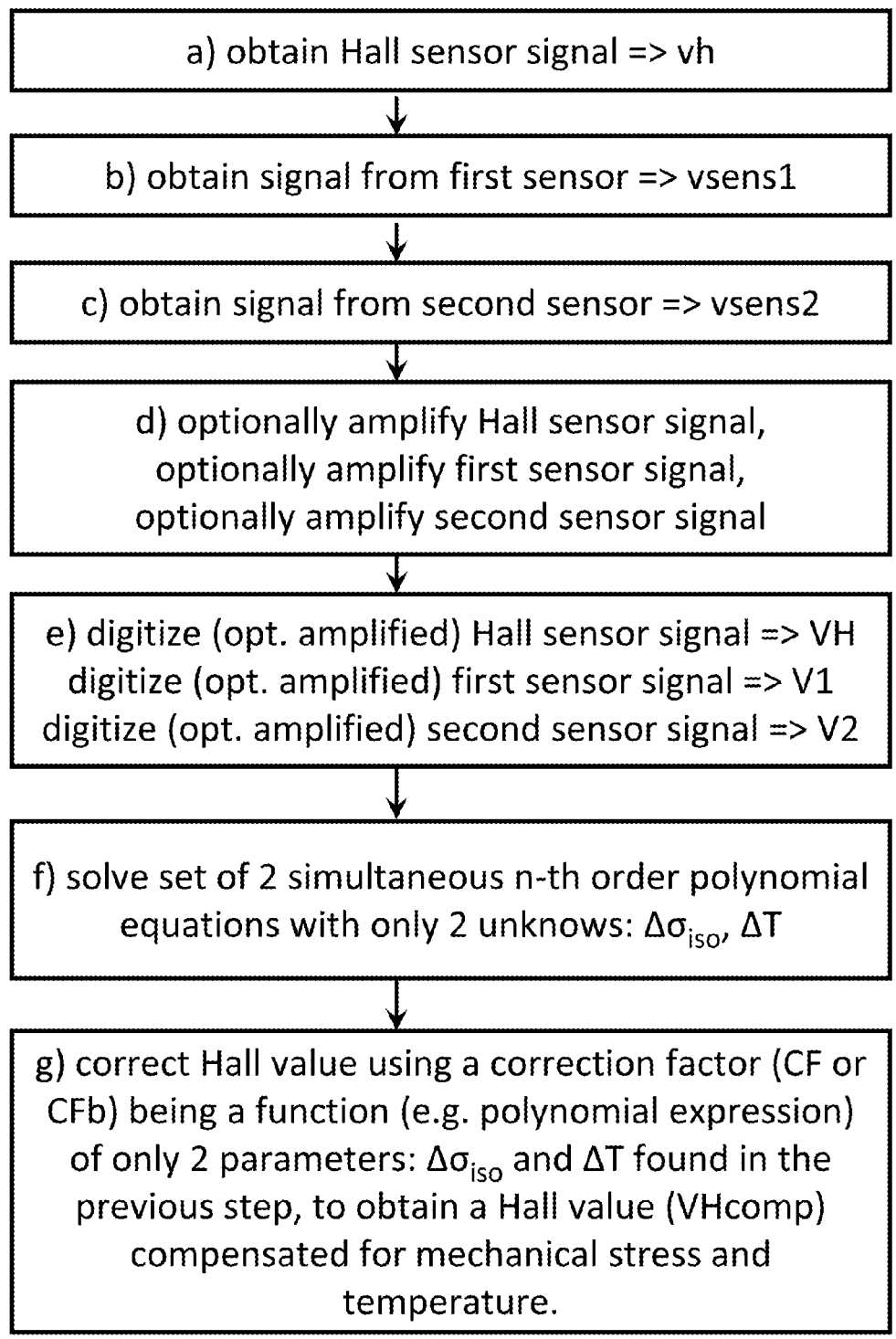
FIG. 13 is a flow-chart of a first method of compensating a Hall signal for temperature and mechanical stress according to an embodiment of the present invention. In this embodiment, after measuring, optionally amplifying, and digitizing the signals from the Hall element(s), first sensor and second sensor, first (in step f) a value for the actual stress and temperature is calculated by solving a set of 2 simultaneous equations, and then (in step g) the calculated value of stress and temperature are used (e.g. filled out in a formula) to calculate a correction factor for compensating the digitized Hall value for stress and temperature.

Method:

FIG. 13 shows a flow-chart of a method 1300 according to an embodiment of the present invention.

In step (a) an output signal of the Hall elements 11 (or an analogue combination, e.g. average or sum or subtraction of output signals from a plurality of interconnected Hall elements) is obtained, In step (b) an output signal of the first sensor 21 (temperature sensor) is obtained, In step (c) an output signal of the second sensor 31 (stress sensor) is obtained, In step (d) the Hall sensor signal is amplified, and optionally the signal from the first sensor 21 is amplified, and optionally the signal of the second sensor 31 is amplified by the differential amplifier 13, In step (e) the amplified Hall signal signal, the signal V1 from the first sensor 21 (optionally after amplification), and the signal V2 from the second sensor 31 (optionally after amplification) are digitized in the ADC 14, and input to the controller 15, In step (f) the values V1, V2 of sensor1 and sensor2 are inserted in one of the sets of equations described above (for example [18] & [19]), and a calculation unit of the controller 15 calculates a value of a stress-free temperature "ΔT" and a value of a temperature-free stress "$\Delta\sigma_{iso}$" by solving the set of equations in the digital domain, In step (g) the digital value VH and the value $\Delta\sigma_{iso}$ of the stress and ΔT of the temperature found in step (f) are inserted for example in formula [20] and [26], and a digital Hall output value VHcomp is obtained, which is compensated for stress and temperature.

It is noted that the order of the steps may be changed and/or that some steps may be combined or split. For example, steps a) to c) could have been formulated as a single step, and/or step d) could have been formulated as three separate steps, but that is merely another formulation. Also, some steps may occur simultaneously, for example: obtaining the Hall signal and amplifying the Hall signal and digitizing the Hall amplified Hall signal may occur simultaneously.

It is also noted that some steps may be performed multiple times, for example, the step of obtaining the Hall voltage from the Hall sensor may be applied four times, whereby each time the Hall element is differently biased (e.g. by a spinning current), and whereby the four results obtained may be averaged or summed, and the individual signals may be combined in the analog domain before or after amplification, but before digitization.

Figure 14:
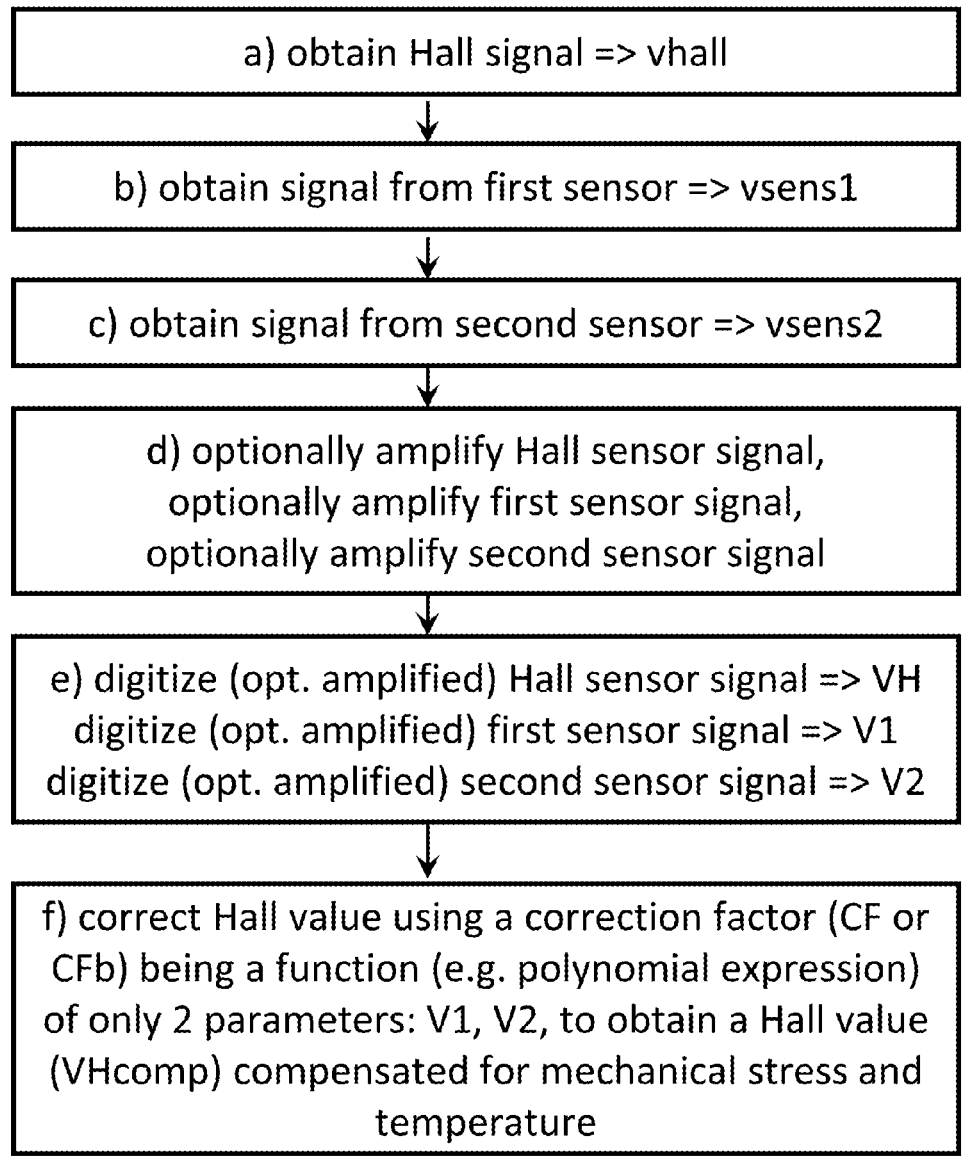
FIG. 14 is a flow-chart of a second method of compensating a Hall signal for temperature and mechanical stress according to an embodiment of the present invention. In this embodiment, after measuring, optionally amplifying, and digitizing the signals from the Hall element(s), first sensor and second sensor, the values obtained from the sensors themselves are used (e.g. filled out in a formula) to calculate a correction factor for compensating the digitized Hall value for stress and temperature, without the need for intermediate step of calculating the actual stress and temperature.

FIG. 14 shows a variant of the method of FIG. 13, as another embodiment of the present invention. During actual implementation and evaluation of samples, the inventors came to the insight that actually, the method of FIG. 13 in step f) performs a first non-linear transformation to convert the measured values (V1, V2) to the values ($\Delta\sigma_{iso}$, ΔT) and then in step g) performs a second non-linear transformation to convert the values ($\Delta\sigma_{iso}$, ΔT) to a correction factor CF or CFb, and they realized that actually the two-step approach is not required for compensating the Hall signal, because the correction factor CF or CFb can be determined directly from the measured values (V1, V2) using a single non-linear direct transformation. In hindsight, after reading his application, this may seem trivial, but as stated above, the "state of the art" devices are approaching the problem of compensating for temperature and stress primarily in ways in which a stress-independent temperature value is obtained, and/or a temperature independent stress-value is obtained, while in fact, it is not required to know either the actual stress or the actual temperature, even when performing calculations in the digital domain, and despite the fact that the physical phenomena are temperature and stress related.

Everything which is described above for the first method illustrated in FIG. 13, and for the device for performing that method, is also applicable here, unless explicitly mentioned otherwise. Specifically, steps a) to e) can be exactly the same, and the calculation means is still configured for calculating a stress-compensated and temperature-compensated Hall value VHcomp using a predefined correction formula CF, CFb in only two parameters. But in contrast to the embodiments described above, where the parameters of the correction formulas are based on a temperature-independent stress value (albeit with respect to a reference stress) and on a stress-independent temperature value (albeit with respect to a reference temperature), in the embodiment of FIG. 14 and the corresponding device, the correction formula is based on the signals V1, V2 obtained directly from the sensors after optional amplification and digitization, without the "detour" of first having to calculate the stress and temperature. And also here, the non-linear translation can be expressed as an n-th order polynomial expression in only two variables/parameters.

The main advantages of this "direct transformation" (as compared to the indirect method of FIG. 13) are: less parameters to be determined during calibration, less computational complexity (no set of equations needs to be solved), less code to be written, smaller memory size, less power processor required and/or lower clock speed required, smaller rounding errors. In short: this embodiment is faster and easier and (for the same order of the polynomial) is more accurate due to rounding errors. Of course, a disadvantage of this embodiment (as compared to that of FIG. 13) is that the true stress and temperature value are not determined, but in most applications that is not required.

First Example

In a first example, the following correction formula can be used:

$$VHcomp = VH/CF \quad [37]$$

wherein the correction factor can be expressed by, or is equivalent to:

$$CF = \sum_{i=0, j=0}^{M} \varphi_{ij}.(\Delta V1)^i.(\Delta V2)^j \quad [38]$$

wherein ΔV1=V1−V1o, ΔV2=V2−V2o, V1o being a digitized and optionally amplified output of the first sensor measured during calibration, V2o being a digitized and optionally amplified output of the second sensor measured during calibration, $\varphi_{ij}$ are predefined constants; M, i, j are integers; and M represents the order of the polynomial. Equation [38], or any equivalent formulation, would then be used instead of equation [22].

As described above, the values of the coefficients may be determined by subjecting the device (e.g. as part of a semiconductor wafer) to a known stress (for example caused by bending the wafer in a known manner, or by exerting a known pressure on the top surface of the wafer), and by varying the temperature of the test environment, and by matching the measured values with the known stress and temperature values using "curve-fitting" techniques. The skilled person can choose an order of the polynomial e.g. 2, find suitable coefficients using known techniques, which need not be explained here, determine a maximum deviation between the polynomial and the measurements, and if that maximum deviation is considered too large, to choose a higher order of the polynomial, and repeat the process until a suitable order is found.

The coefficients and the order of the polynomials may be determined in any suitable way. As an example only, the invention not being limited thereto, the calibration method as described in US2015142342 can be used, i.e. stress variation may be obtained from any of wafer probing vs. packaged device, humid package vs. dry package, wafer bending, 4-point bending bridge hydrostatic pressure. The combination of data between wafer probing and final test (in package) is considered to be particularly useful.

Second Example

In a second example, the following correction formula can be used:

$$VHcomp = VH \times CFb, \quad [39]$$

wherein the correction factor CFb can be expressed by, or is equivalent to:

$$CFb = \sum_{i=0, j=0}^{R} \eta_{ij} \cdot (\Delta V1)^i \cdot (\Delta V2)^j \quad [40]$$

wherein $\Delta V1 = V1 - V1o$, $\Delta V2 = V2 - V2o$, V1o being a digitized and optionally amplified output of the first sensor (21) measured during calibration, V2o being a digitized and optionally amplified output of the second sensor (31) measured during calibration, $\eta_{ij}$ are predefined constants, R, i, j are integers, and R represents the order of the polynomial. Equation [40], or any equivalent formulation, would then be used instead of equation [22].

Preferred Embodiments

In preferred embodiments, the polynomial of the correction factor CF, CFb is one of:
  i) a second order polynomial in both variables $\Delta V1$, $\Delta V2$, or
  ii) a polynomial of third order in the variable $\Delta V1$ related to the sensor having the highest temperature sensitivity TS1 of the first and second sensor 21, 31 (referred to herein as the "temperature sensor") and of first order in the other variable $\Delta V2$ related to the second sensor (referred to herein as the "stress sensor"), or
  iii) a polynomial of fourth order in the variable $\Delta V1$ related to the sensor having the highest temperature sensitivity TS1 of the first and second sensor 21, 31 and of first order in the other variable $\Delta V2$.

The following formulae were found to provide surprisingly good results:

$$CFb = 1 + \eta_{10} \cdot (\Delta V1) + \eta_{20} \cdot (\Delta V1)^2 + \eta_{30} \cdot (\Delta V1)^3 + \eta_{01} \cdot (\Delta V2) \quad [41],$$

$$CFb = 1 + \eta_{10} \cdot (\Delta V1) + \eta_{20} \cdot (\Delta V1)^2 + \eta_{30} \cdot (\Delta V1)^3 + \eta_{01} \cdot (\Delta V2) + \eta_{11} \cdot (\Delta V1) \cdot (\Delta V2) \quad [42],$$

wherein $\Delta V1$ is related to the sensor having the highest temperature sensitivity, and $\Delta V2$ is related to the sensor having the highest stress sensitivity.

Optionally in case ii) or case iii) the calculation means is adapted for evaluating the polynomial expression as a piecewise linear or a piecewise quadratic approximation using equidistant or non-equidistant intervals of the first and/or second variable $\Delta V1$, $\Delta V2$. It is noted that "piecewise linear approximation" or "piecewise quadratic approximation" boils down to not using a single set of coefficients for the entire measurement range ($\Delta\sigma_{iso}$, $\Delta T$) or (V1, V2), but to choose a set of coefficients from a plurality of at least two sets of coefficients, based on the measured values V1 and V2.

In a first example of piecewise linear approximation or piecewise quadratic approximation, a first set of coefficients may be used if (V1low<=V1measured<=V1mid) and may use a second set of coefficients if (V1mid<V1measured<=V1high), irrespective of V2. In this example, the V1-axis is partitioned in two sub-regions.

In a second example, the V1-axis is partitioned in three sub-regions, and the V2-axis is partitioned in two sub-regions, in which case there would be six sets of coefficients. Depending on the values of V1, V2 measured, the correct set would be chosen.

But of course, the present invention invention is not limited to these two examples, but each of the V1-axis and the V2-axis may be partitioned in two, three, four, or more than four sub-regions, independently.

The main advantage of using piecewise linear or quadratic approach is that for a given order of the polynomial, and for a given number of bits of the coefficients, the accuracy of the result can be increased.

Figure 15:
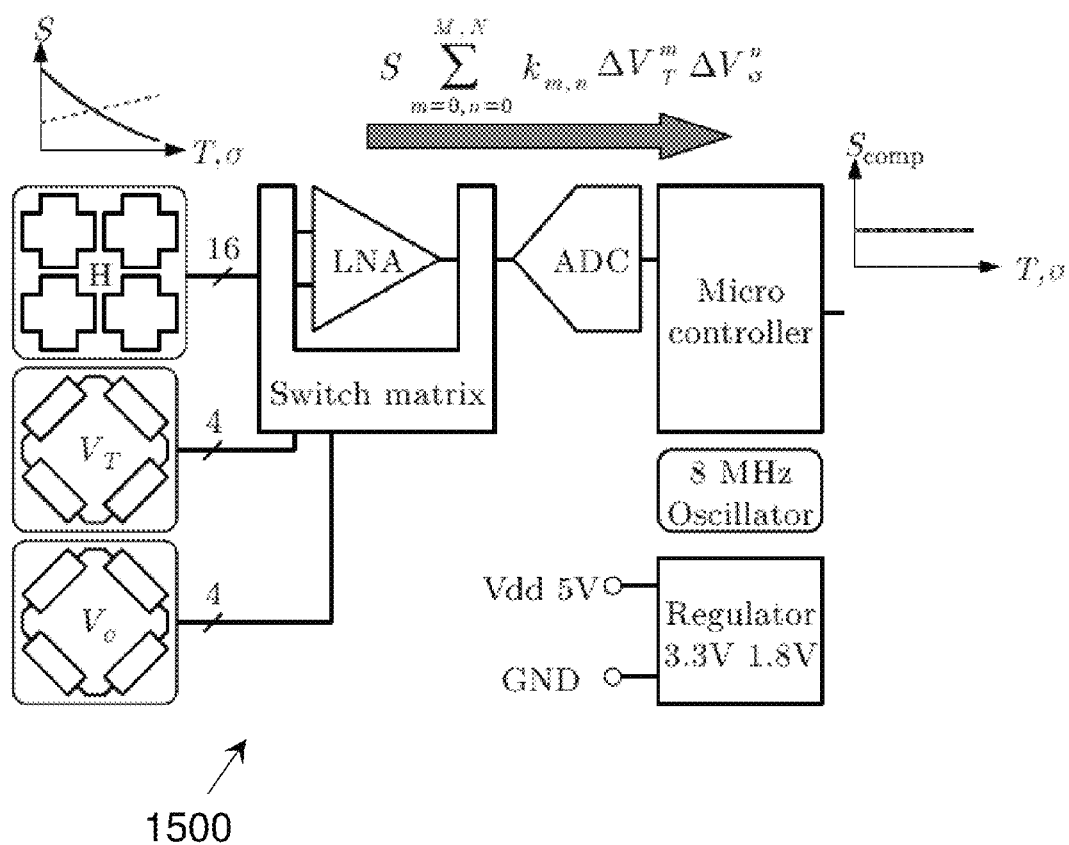
FIG. 15 shows another exemplary embodiment of the device according to the present invention. In this case four Hall elements are interconnected, or the signals are otherwise combined to obtain the effect of "current spinning". The microcontroller can be programmed with a program for performing the first method (see FIG. 13) or the second method (see FIG. 14), or both.

FIG. 15 shows a block-diagram very similar to that of FIG. 1, which can be used to implement the method described in FIG. 14, but the circuit of FIG. 1 or FIG. 2 could also be used here. Actually, the only real difference with FIG. 1 is that the micro-controller is programmed with a different algorithm. As mentioned in relation to FIG. 2, the Low Noise Amplifier LNA is not absolutely required, and can be omitted for example if the digitizer ADC has sufficient accuracy.

Figure 16:
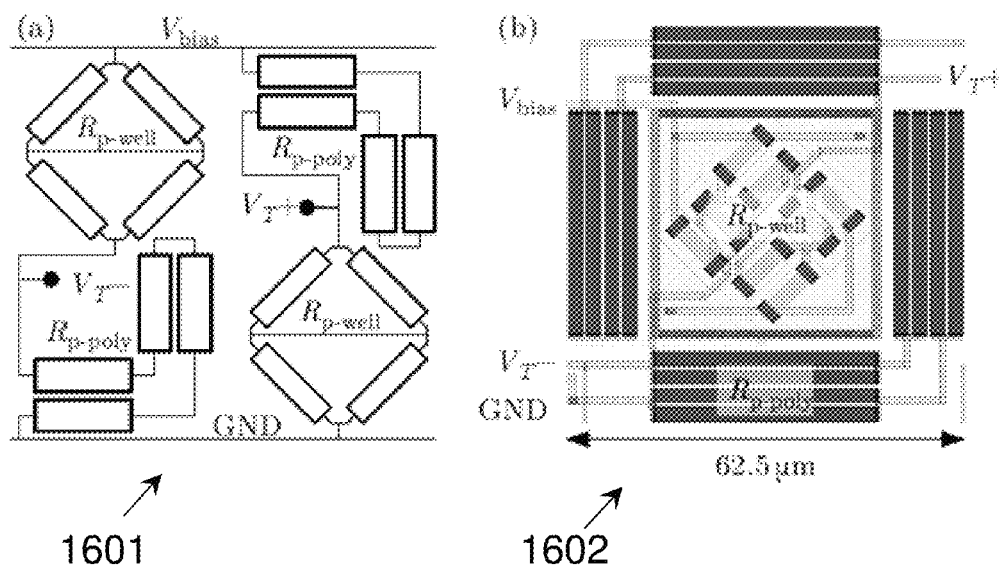
FIG. 16 shows another example of a "temperature sensor" as can be used in embodiments of the present invention, which may have a stress sensitivity quite different from zero.

FIG. 16 shows another example of a "temperature sensor" as may be used in embodiments of the present invention, irrespective of whether the first algorithm (see FIG. 13) or the second algorithm (see FIG. 14) is used. FIG. 16(a) is a schematic diagram, FIG. 16(b) is a layout-implementation. It is noted that this temperature sensor is not located around a Hall element, but can be located anywhere on a semiconductor substrate. The temperature sensor shown consists of 16 appropriately arranged p-well and p-type polysilicon resistor segments which are connected to form a Wheatstone bridge. The chosen combination of resistor materials provides high thermal sensitivity and keeps the parasitic cross-sensitivity with respect to mechanical stress small. Additionally, the four resistor segments representing a single bridge resistor are connected as double L-shape resistors. Therefore, the remaining stress sensitivity is isotropic with respect to the in-plane normal stresses; such that it can be compensated with the on-chip stress sensor. It may be noted that this temperature sensor uses a parallel connection of the p-well resistors mainly to obtain an output impedance of about 10 kOhm.

Figure 17:
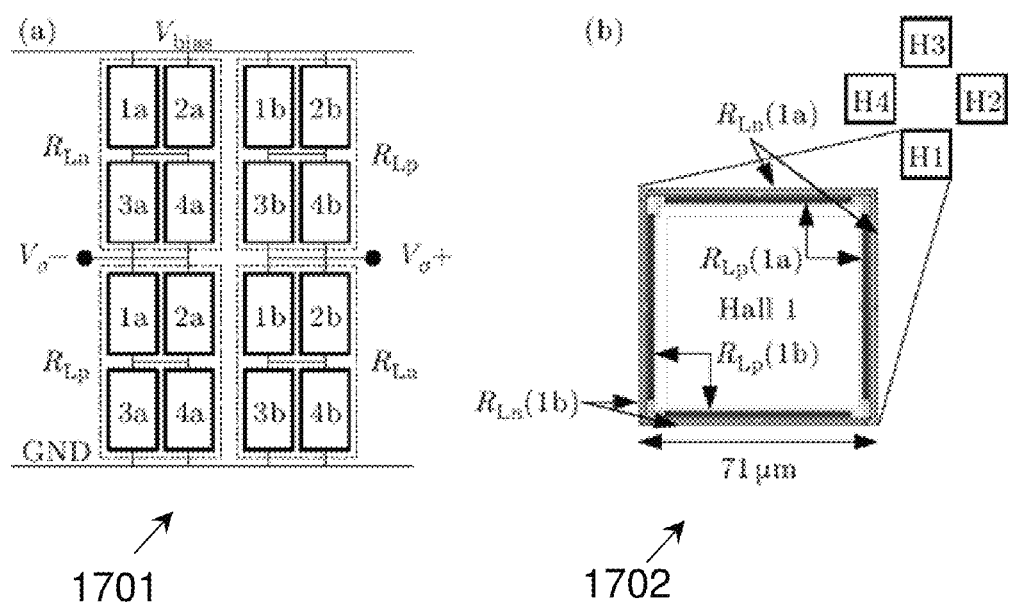
FIG. 17 shows another example of a "stress sensor" as can be used in embodiments of the present invention, which may have a temperature sensitivity quite different from zero.

FIG. 17 shows another example of a "stress sensor" as may be used in embodiments of the present invention, irrespective of whether the first algorithm (see FIG. 13) or the second algorithm (see FIG. 14) is used. FIG. 17(a) is a schematic diagram, FIG. 17(b) is a layout-implementation. It is noted that the resistor strips in this case are organized as a parallel connection, which improves accuracy. This stress sensor is made of 16 highly doped n-type and p-type L-shaped resistors which are arranged around each of the four Hall elements and connected to build a single stress sensor. The resistor materials, namely highly doped n-type and p-type, are selected in such a way as to keep the thermal cross-sensitivity relatively low while at the same time providing a relatively high stress sensitivity. The resistors are connected to form a Wheatstone bridge.

Since the temperature sensor of FIG. 16 and the stress sensor of FIG. 17 use different materials, they have a different temperature and stress sensitivity, and hence can be suitably combined in a single device according to the present invention.

Experimental Results:

Experiments with CMOS samples packaged in standard TSSOP-16 molded plastic packages have demonstrated that the parasitic changes of the magnetic sensitivity "S" in the range from +46% to −37% with respect to a temperature range from −40° C. to +120° C. and up to 2.6% with respect to mechanical stress were simultaneously compensated by a two-dimensional polynomial in only two parameters: stress and temperature. In the experiment, the order of the temperature (or V1) was three, and the order of the stress (or V2) was one. The residual error on the magnetic sensitivity S after the compensation using the second method based on V1 and V2, was found to be smaller than ±0.4%. It is very surprising that such high accuracy can be obtained by a relatively simple calculation, moreover using two sensors, both having a non-zero stress and temperature sensitivity.

FINALLY

While the numerical examples described above were given with Silicon substrates, more in particular with silicon wafers cut in the (100) plane, and with a CMOS process in mind, the principles of the present invention may also be applied in other semiconductor devices (such as e.g. devices comprising vertical Hall elements, and even to critical circuits such as bandgap references) and/or other processes used, (such as e.g. Gallium-Arsenide or Indium-Antimonide Hall elements) by changing the numerical values, and optionally also the angular orientations of the resistor strips. The invention is not only useful for stress compensation due to plastic molded packages, but can also be used for compensation stress due for example hydrostatic pressure, overmolding on module level, stress due to soldering, humidity, etc.

Although in the preferred embodiments described above the first and second lateral isotropic sensor 21, 31 consist of resistive elements R1a-R1d and R2a-R2d, that is not absolute required, and sensor elements of another kind, for example lateral isotropic capacitive sensors may also be used.

Also, even though in the preferred embodiments described above each lateral isotropic sensor element is composed of a plurality of resistive elements arranged in a bridge circuit for allowing differential measurement, that is not absolutely required, and other readout-circuits, (e.g. providing an absolute measurement instead of a differential measurement) may also be used.

The invention claimed is:

1. An integrated semiconductor device for measuring a magnetic field strength, comprising:
   at least one Hall element configured for providing a Hall signal indicative of the magnetic field strength to be measured;
   a first lateral isotropic sensor having a first stress sensitivity and a first temperature sensitivity and configured for providing a first sensor signal;
   a second lateral isotropic sensor having a second stress sensitivity, and having a second temperature sensitivity and configured for providing a second sensor signal;
   wherein the first temperature sensitivity is different from the second temperature sensitivity or the first stress sensitivity is different from the second stress sensitivity or both;
   digitization means arranged for digitizing the Hall signal and the first sensor signal and the second sensor signal so as to obtain three digital values;
   calculation means configured for solving a set of only two simultaneous polynomial equations with predefined coefficients in only two variables in order to obtain a stress-value and a temperature-value,
   and configured for calculating a stress-compensated and temperature-compensated Hall value using a predefined correction formula in only two parameters being said calculated stress value and said calculated temperature value.

2. An integrated semiconductor device according to claim 1, wherein the polynomial equations of the simultaneous set of only two equations are two n-th order polynomials in only two variables, which set of only two equations is expressed by, or equivalent to the following set of equations:

$$\begin{cases} V_1 = \sum_{i=0,j=0}^{K} \alpha_{ij}.\Delta\sigma_{iso}^i.\Delta T \\ V_2 = \sum_{i=0,j=0}^{L} \beta_{ij}.\Delta\sigma_{iso}^i.\Delta T^j \end{cases}$$

where V1 is the digitized output value of the first sensor, V2 is the digitized output value of the second sensor, $\alpha_{ij}$ and $\beta_{ij}$ are constants, K, L, i, j are integer values, $\Delta\sigma_{iso}$ represents mechanical stress relative to a reference stress, and $\Delta T$ represents temperature relative to a reference temperature, and K represents the order of the polynomial of the first equation, and L represents the order of the polynomial of the second equation.

3. An integrated semiconductor device according to claim 1,
   wherein the set of equations is a set of second order polynomial equations, or
   wherein the set of equations can be expressed by, or is equivalent to:

$$\begin{cases} \Delta V1 = \alpha_{11}.\Delta\sigma_{iso}\Delta T + \alpha_{02}.\Delta T \wedge 2 + \alpha_{10}.\Delta\sigma_{iso} + \alpha_{01}.\Delta T \\ \Delta V2 = \beta_{11}.\Delta\sigma_{iso}\Delta T + \beta_{02}.\Delta T \wedge 2 + \beta_{10}.\Delta\sigma_{iso} + \beta_{01}.\Delta T \end{cases}$$

4. An integrated semiconductor device according to claim 1, wherein the predefined correction formula can be expressed by, or is equivalent to one of:
   a) the formula: VHcomp=VH/CF,
   wherein CF is a correction factor, which can be expressed by, or is equivalent to the following n-th order polynomial in only two variables:

$$CF = \sum_{i=0,j=0}^{M} \gamma_{ij}.\Delta\sigma_{iso}^i.\Delta T^j$$

wherein $\gamma_{ij}$ are predefined constants, M, i, j are integers, and ($\Delta\sigma_{iso}$) and ($\Delta T$) are the values calculated from the set of two simultaneous equations, and M represents the order of the polynomial;
   b) the formula: VHcomp=VH×CFb,
   where CFb is a correction factor, which can be expressed by, or is equivalent to the following n-th order polynomial in only two variables:

$$CFb = \sum_{i=0, j=0}^{R} \tau_{ij} . \Delta\sigma_{iso}^{i} . \Delta T^{j}$$

wherein $\tau_{ij}$ are predefined constants, R, i, j are integers, and ($\Delta\sigma_{iso}$) and ($\Delta T$) are the values calculated from the set of two simultaneous equations, and R represents the order of the polynomial.

5. An integrated semiconductor device according to claim 4, wherein the polynomial of the correction factor is one of:
i) a second order polynomial in both variables;
ii) a polynomial of third order in the variable related to the sensor having the highest temperature sensitivity of the first and second sensor and of first order in the other variable;
iii) a polynomial of fourth order in the variable related to the sensor having the highest temperature sensitivity of the first and second sensor and of first order in the other variable;
and optionally wherein in case ii) or case iii) the calculation means is adapted for evaluating the polynomial expression as a piecewise linear or a piecewise quadratic approximation using equidistant or non-equidistant intervals of the first and/or second variable.

6. An integrated semiconductor device according to claim 1,
further comprising non-volatile storage means operatively connected to the calculation means, the storage means being adapted for storing at least two values determined during calibration, and optionally for storing also the predefined coefficients of the polynomial equations; and/or
further comprising means for biasing the at least one Hall element and the first sensor and the second sensor with a constant predefined voltage, and/or
wherein the at least one Hall element is a horizontal Hall plate.

7. An integrated semiconductor device according to claim 1, wherein each of the first lateral isotropic sensor and the second lateral isotropic sensor is a resistive sensor comprising four lateral isotropic resistors.

8. An integrated semiconductor device according to claim 7, wherein:
each of the lateral isotropic resistors comprise at least two lateral resistor strips organized as an orthogonal pair, connected in series; and/or
wherein at least some of the lateral isotropic resistors comprise at least four lateral resistor strips connected in series in a double-L shape.

9. An integrated semiconductor device according to claim 7, wherein materials of the resistors are chosen such that:
a) two resistors of the first lateral isotropic sensor are made of a first material and the two other resistors of the first lateral isotropic sensor are made of a second material, and two resistors of the second lateral isotropic sensor are made of a third material and the two other resistors of the second lateral isotropic sensor are made of a fourth material, and at least three of the first, second, third and fourth material are different materials; or
b) two of the resistors of the first sensor are p-well resistors, and two other of the resistors of the first sensor are p-poly resistors, and two of the resistors of the second sensor are heavily doped p-type resistors, and two other of the resistors of the second sensor are heavily doped n-type resistors; or
c) two of the resistors of the first sensor are heavily doped p-type resistors, and two other of the resistors of the first sensor are p-poly resistors, and two of the resistors of the second sensor are heavily doped n-type resistors, and two other of the resistors of the second sensor are heavily doped p-type resistors; or
d) two of the resistors of the first sensor are n-well resistors, and two other of the resistors of the first sensor are p-poly resistors, and two of the resistors of the second sensor are heavily doped n-type resistors, and two other of the resistors of the second sensor are heavily doped p-type resistors.

10. An integrated semiconductor device according to claim 1,
wherein the integrated semiconductor device comprises a number of at least two Hall elements located on an imaginary circle, and a single first lateral isotropic sensor located inside the circle, and the same number of second sensors, each arranged around one of the Hall elements, or
wherein the integrated semiconductor device comprises a number of at least two Hall elements, each Hall element having a corresponding first sensor and a corresponding second sensor arranged around the Hall element.

11. A method of measuring a magnetic field strength compensated for mechanical stress and for temperature, using a semiconductor device according to claim 1, the method comprising the steps of:
obtaining a Hall signal from said at least one Hall element;
obtaining a first sensor signal from the first lateral isotropic sensor;
obtaining a second sensor signal from the second lateral isotropic sensor;
digitizing the Hall signal and the first sensor signal and the second sensor signal so as to obtain three digital values;
calculating a stress value and a temperature value that satisfy a predetermined set of only two simultaneous n-th order polynomial equations in only two variables with predefined coefficients and with the digitized first and second sensor signals as parameters;
calculating a stress compensated and temperature compensated Hall value using a correction factor being a n-th order polynomial expression in only two variables and with predefined coefficients.

12. An integrated semiconductor device for measuring a magnetic field strength, comprising:
at least one Hall element configured for providing a Hall signal indicative of the magnetic field strength to be measured;
a first lateral isotropic sensor having a first stress sensitivity and a first temperature sensitivity and configured for providing a first sensor signal;
a second lateral isotropic sensor having a second stress sensitivity, and having a second temperature sensitivity and configured for providing a second sensor signal;
wherein the first temperature sensitivity is different from the second temperature sensitivity or the first stress sensitivity is different from the second stress sensitivity or both;
digitization means arranged for digitizing the Hall signal and the first sensor signal and the second sensor signal so as to obtain three digital values;
calculation means configured for calculating a stress-compensated and temperature-compensated Hall value using a predefined correction formula in only two parameters being said digitized first sensor signal and said digitized second sensor signal.

13. An integrated semiconductor device according to claim 12, wherein the predefined correction formula can be expressed by, or is equivalent to one of:
a) the formula: VHcomp=VH/CF,
wherein CF is a correction factor, which can be expressed by, or is equivalent to the following n-th order polynomial in only two variables:

$$CF = \sum_{i=0, j=0}^{M} \varphi_{ij}.(\Delta V1)^i.(\Delta V2)^j$$

wherein ΔV1=V1−V1o, ΔV2=V2−V2o, V1o being a digitized output of the first sensor measured during calibration, V2o being a digitized output of the second sensor measured during calibration, $\varphi_{ij}$ are predefined constants; M, i, j are integers; and M represents the order of the polynomial; or
b) the formula: VHcomp=VH×CFb,
where CFb is a correction factor, which can be expressed by, or is equivalent to the following n-th order polynomial in only two variables:

$$CFb = \sum_{i=0, j=0}^{R} \eta_{ij}.(\Delta V1)^i.(\Delta V2)^j$$

wherein ΔV1=V1−V1o, ΔV2=V2−V2o, V1o being a digitized output of the first sensor measured during calibration, V2o being a digitized output of the second sensor measured during calibration, $\eta_{ij}$ are predefined constants, R, i, j are integers, and R represents the order of the polynomial.

14. An integrated semiconductor device according to claim 12, wherein the polynomial of the correction factor is one of:
i) a second order polynomial in both variables;
ii) a polynomial of third order in the variable related to the sensor having the highest temperature sensitivity of the first and second sensor and of first order in the other variable;
iii) a polynomial of fourth order in the variable related to the sensor having the highest temperature sensitivity of the first and second sensor and of first order in the other variable;
and optionally wherein in case ii) or case iii) the calculation means is adapted for evaluating the polynomial expression as a piecewise linear or a piecewise quadratic approximation using equidistant or non-equidistant intervals of the first and/or second variable.

15. An integrated semiconductor device according to claim 12,
further comprising non-volatile storage means operatively connected to the calculation means, the storage means being adapted for storing at least two values determined during calibration, and optionally for storing also the predefined coefficients of the polynomial equations; and/or
further comprising means for biasing the at least one Hall element and the first sensor and the second sensor with a constant predefined voltage, and/or wherein the at least one Hall element is a horizontal Hall plate.

16. An integrated semiconductor device according to claim 12, wherein each of the first lateral isotropic sensor and the second lateral isotropic sensor is a resistive sensor comprising four lateral isotropic resistors.

17. An integrated semiconductor device according to claim 16, wherein:
each of the lateral isotropic resistors comprise at least two lateral resistor strips organized as an orthogonal pair, connected in series; and/or
wherein at least some of the lateral isotropic resistors comprise at least four lateral resistor strips connected in series in a double-L shape.

18. An integrated semiconductor device according to claim 16, wherein materials of the resistors are chosen such that:
a) two resistors of the first lateral isotropic sensor are made of a first material and the two other resistors of the first lateral isotropic sensor are made of a second material, and two resistors of the second lateral isotropic sensor are made of a third material and the two other resistors of the second lateral isotropic sensor are made of a fourth material, and at least three of the first, second, third and fourth material are different materials; or
b) two of the resistors of the first sensor are p-well resistors, and two other of the resistors of the first sensor are p-poly resistors, and two of the resistors of the second sensor are heavily doped p-type resistors, and two other of the resistors of the second sensor are heavily doped n-type resistors; or
c) two of the resistors of the first sensor are heavily doped p-type resistors, and two other of the resistors of the first sensor are p-poly resistors, and two of the resistors of the second sensor are heavily doped n-type resistors, and two other of the resistors of the second sensor are heavily doped p-type resistors; or
d) two of the resistors of the first sensor are n-well resistors, and two other of the resistors of the first sensor are p-poly resistors, and two of the resistors of the second sensor are heavily doped n-type resistors, and two other of the resistors of the second sensor are heavily doped p-type resistors.

19. An integrated semiconductor device according to claim 12,
wherein the integrated semiconductor device comprises a number of at least two Hall elements located on an imaginary circle, and a single first lateral isotropic sensor located inside the circle, and the same number of second sensors, each arranged around one of the Hall elements, or
wherein the integrated semiconductor device comprises a number of at least two Hall elements, each Hall element having a corresponding first sensor and a corresponding second sensor arranged around the Hall element.

20. A method of measuring a magnetic field strength compensated for mechanical stress and for temperature, using a semiconductor device according to claim 12, the method comprising the steps of:
obtaining a Hall signal from said at least one Hall element;
obtaining a first sensor signal from the first lateral isotropic sensor;
obtaining a second sensor signal from the second lateral isotropic sensor;

digitizing the Hall signal and the first sensor signal and the second sensor signal so as to obtain three digital values;

calculating a stress compensated and temperature compensated Hall value using a correction factor being a n-th order polynomial expression in only two parameters and with predefined coefficients.

* * * * *